(12) United States Patent
Bischoff et al.

(10) Patent No.: US 10,204,179 B2
(45) Date of Patent: Feb. 12, 2019

(54) SIMPLIFIED CONSTRUCTION OF A PHOTOVOLTAIC SYSTEM WITH A CONSECUTIVELY PLACED SYSTEM BLOCK

(71) Applicant: Siemens Aktiengesellschaft, Munich (DE)

(72) Inventors: Martin Bischoff, Holzkirchen (DE); Frederik Brandes, Nuremberg (DE); Oliver Hennig, Munich (DE); Karl-Heinz Kufer, Weilerbach (DE); Kai Plociennik, Kaiserlautern (DE); Ingmar Schule, Kaiserslautern (DE)

(73) Assignee: SIEMENS AKTIENGSELLSCHAFT, Munich (DE)

( * ) Notice: Subject to any disclaimer, the term of this patent is extended or adjusted under 35 U.S.C. 154(b) by 1118 days.

(21) Appl. No.: 14/370,779

(22) PCT Filed: Nov. 6, 2012

(86) PCT No.: PCT/EP2012/071912
§ 371 (c)(1),
(2) Date: Jul. 6, 2014

(87) PCT Pub. No.: WO2013/104446
PCT Pub. Date: Jul. 18, 2013

(65) Prior Publication Data
US 2015/0006118 A1 Jan. 1, 2015

(30) Foreign Application Priority Data

Jan. 11, 2012 (DE) .................. 10 2012 100 197
Jul. 7, 2012 (DE) .................. 10 2012 106 130

(51) Int. Cl.
*G06F 17/50* (2006.01)
*G06Q 10/04* (2012.01)
*H02S 20/00* (2014.01)

(52) U.S. Cl.
CPC .......... *G06F 17/50* (2013.01); *G06Q 10/043* (2013.01); *H02S 20/00* (2013.01)

(58) Field of Classification Search
CPC ........ G06F 17/50; G06Q 10/043; H02S 20/00
See application file for complete search history.

(56) References Cited

U.S. PATENT DOCUMENTS 4,317,272 A * 3/1982 Kuo ...................... H01L 23/522
257/208
6,331,671 B1 * 12/2001 Makita .................... H02S 20/23
136/244

(Continued)

FOREIGN PATENT DOCUMENTS

CN 1248070 A 3/2000
CN 1274174 A 11/2000

(Continued)

OTHER PUBLICATIONS

Dung Duc Nguyen, Modeling and Reconfiguration of SOlar Photovoltaic Arrays under non-uniform shadow conditions, Thesis, The Department of Electrical and Computer Engieering, Northeastern University, Boston, Massachusetts, Jul. 2008. p. 1-169.*

(Continued)

*Primary Examiner* — Aniss Chad
*Assistant Examiner* — Chuen-Meei Gan
(74) *Attorney, Agent, or Firm* — Beusse Wolter Sanks & Maire

(57) ABSTRACT

A method for defining a structure of a photovoltaic system on a system surface with a local topology is provided, including: first placement of a block at a location on the (Continued)

system surface with the local topology; placing additional blocks at additional locations on the system surface without overlapping previously placed blocks, wherein prior to each placement, row spacing of the solar panels of each additional block is adapted to the topology at the location at which the respective additional block was placed, resulting in a change in the extension of the additional block in the direction of the column of solar panels of the additional block, and ending the placement of additional blocks if, by the placement of an additional block, the nominal capacity of a photovoltaic system corresponding to the structure were to be exceeded, or if no additional block can be placed without overlapping previously placed blocks.

20 Claims, 21 Drawing Sheets

(56) References Cited

U.S. PATENT DOCUMENTS

| | | | | |
|---|---|---|---|---|
| 6,350,944 | B1* | 2/2002 | Sherif | H01L 31/042 136/244 |
| 6,546,535 | B1* | 4/2003 | Nagao | G06F 11/2035 136/243 |
| 6,635,817 | B2* | 10/2003 | Chang | H01L 31/02021 136/244 |
| 9,465,908 | B2* | 10/2016 | Bischoff | G06F 17/50 |
| 2009/0234692 | A1* | 9/2009 | Powell | G06F 17/30241 705/26.4 |
| 2010/0217724 | A1 | 8/2010 | Brenner | |
| 2010/0295383 | A1* | 11/2010 | Cummings | H01L 31/02021 307/151 |
| 2010/0314509 | A1* | 12/2010 | Conger | F24J 2/5241 248/121 |
| 2011/0031814 | A1* | 2/2011 | Giesler | H02J 13/0082 307/77 |
| 2011/0032099 | A1* | 2/2011 | Giesler | G08B 13/1409 340/568.1 |
| 2011/0148210 | A1* | 6/2011 | Cherukupalli | H01L 31/02021 307/77 |
| 2011/0205245 | A1* | 8/2011 | Kennedy | F24J 2/40 345/636 |
| 2013/0246010 | A1* | 9/2013 | Dershowitz | H01L 31/042 703/1 |

FOREIGN PATENT DOCUMENTS

| | | |
|---|---|---|
| CN | 102163341 A | 8/2011 |
| EP | 2215409 A1 | 8/2010 |
| WO | 2009046459 A1 | 4/2009 |

OTHER PUBLICATIONS

M Bischoff, Improved planning of photovoltaic power plants, Nov. 2012, p. 1-3.*
HelioScope User Manual, FOLSOM Labs, p. 1-40 Date and Revision Aug. 2014 (Year: 2014).*
SolarEdge Site Designer V2.3, p. 1-27 (Year: 2010).*
Tim Schroder; Solarparks flotter planen; pp. 22-23; Weiter.vorn; Frauenhofer Magazin; 2012; DE; Apr. 1, 2012; the whole document.
CN Office Action dated Nov. 6, 2016, for CN patent application No. 2012800708419.
CN Office Action dated Jul. 12, 2017, for CN patent application No. 201280070841.9.

* cited by examiner

FIG 1.1
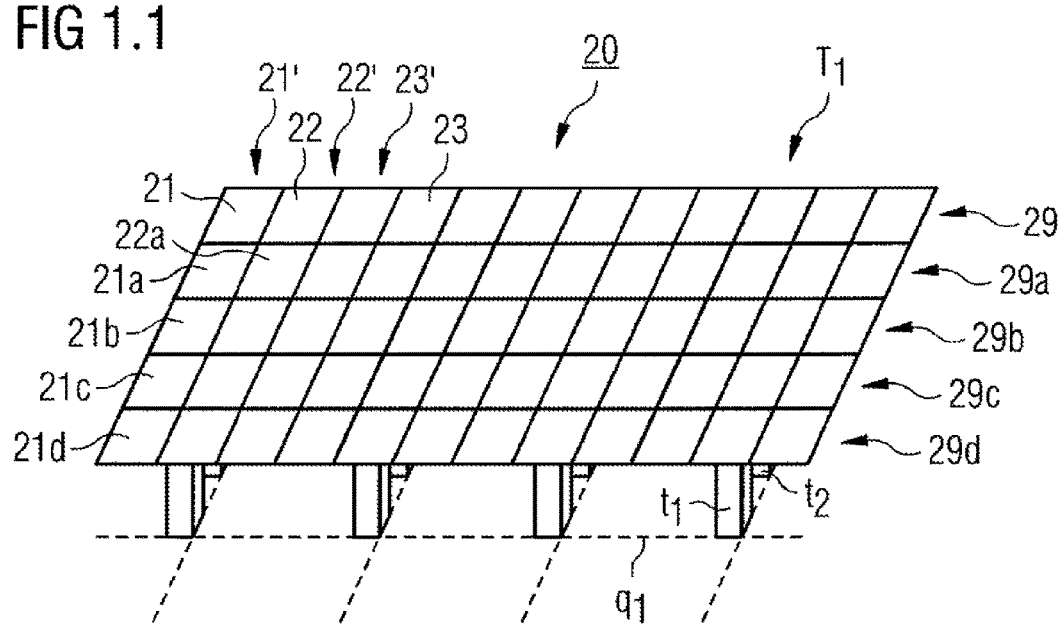
FIG 1.2
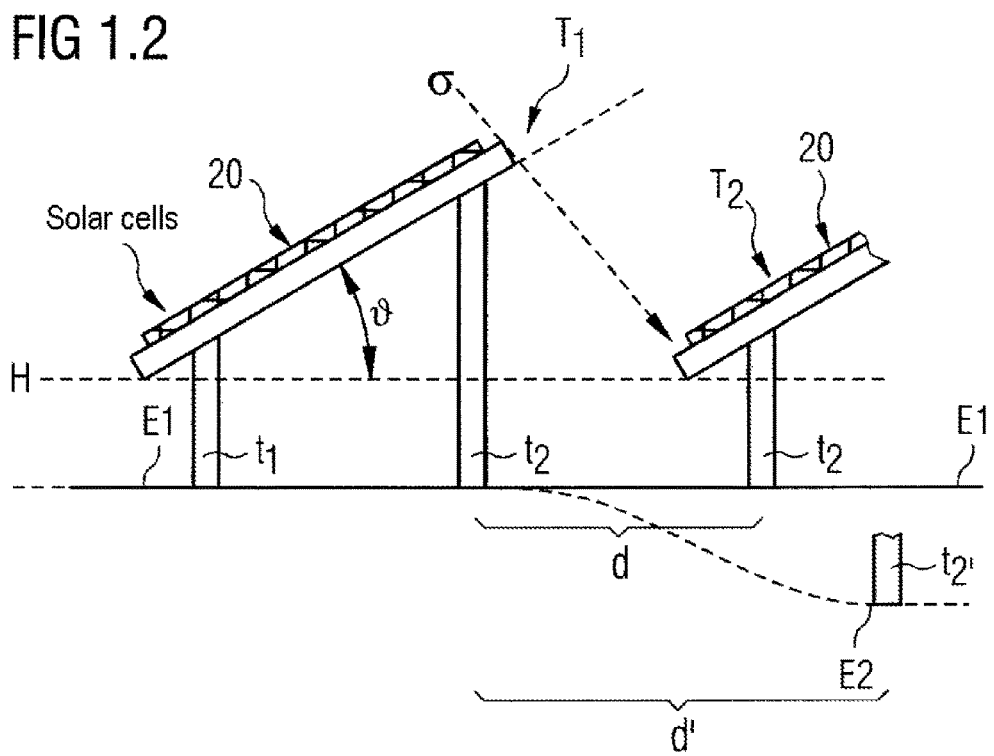

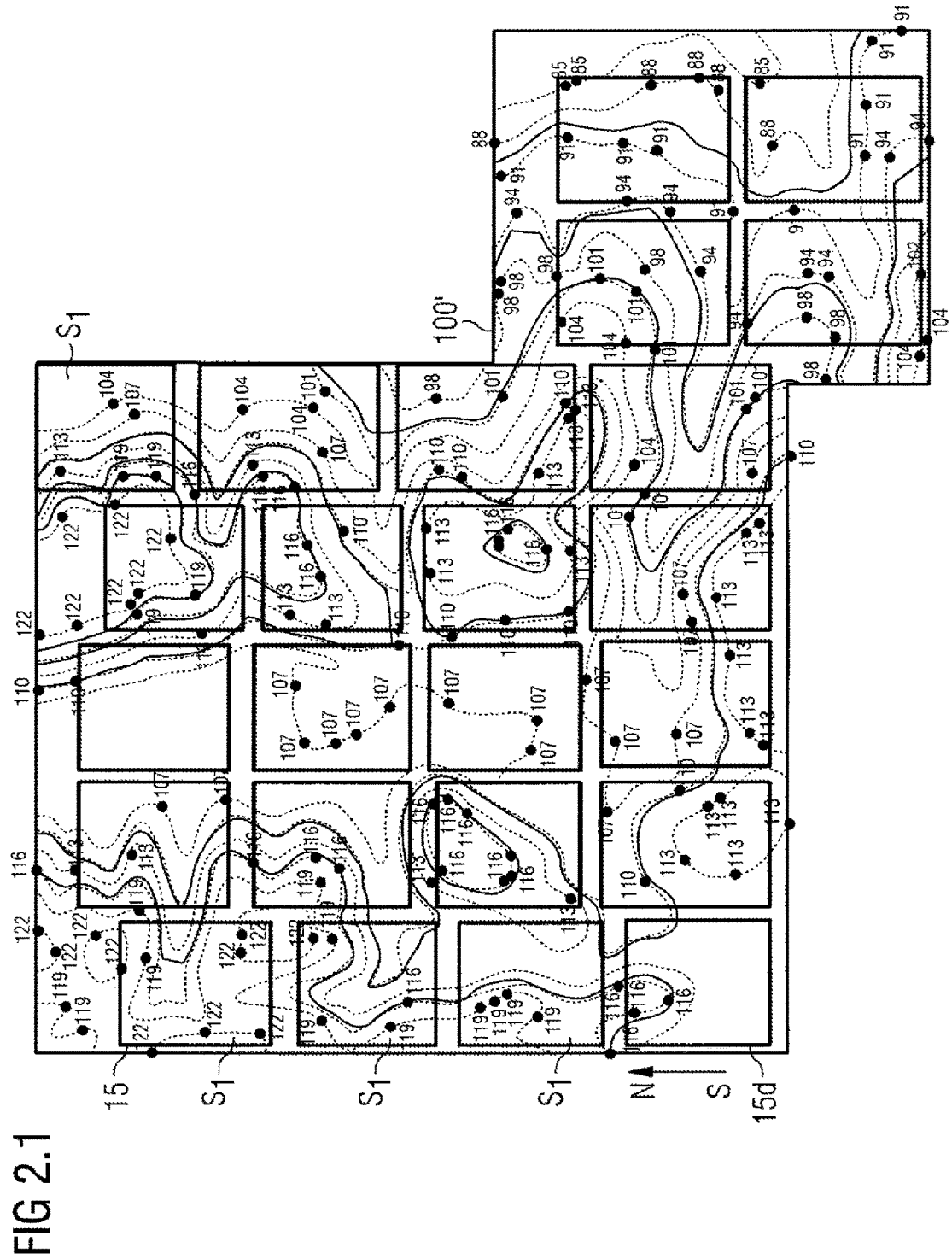
FIG 2.1

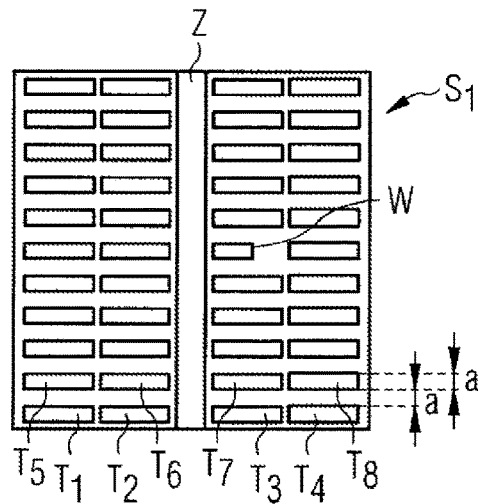
FIG 3
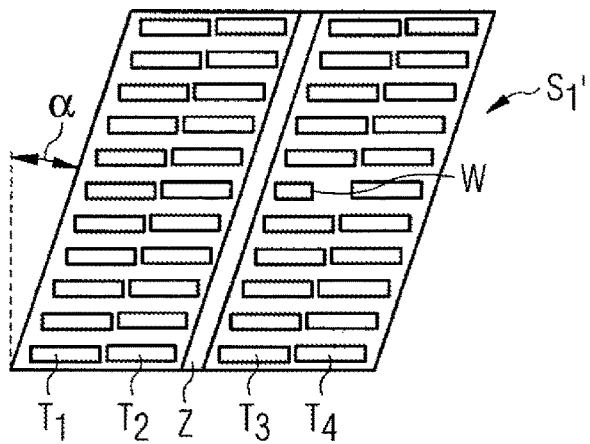
FIG 3.1
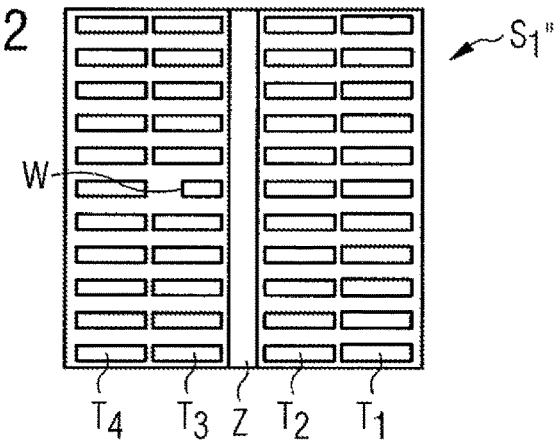
FIG 3.2

SIMPLIFIED CONSTRUCTION OF A PHOTOVOLTAIC SYSTEM WITH A CONSECUTIVELY PLACED SYSTEM BLOCK

CROSS REFERENCE TO RELATED APPLICATIONS

This application is the US National Stage of International Application No. PCT/EP2012/071912 filed Nov. 6, 2012, and claims the benefit thereof. The International Application claims the benefit of German Application No. DE 10 2012 106 130.0 filed Jul. 7, 2012 and German Application No. DE 10 2012 100 197.9 filed Jan. 11, 2012. All of the applications are incorporated by reference herein in their entirety.

FIELD OF INVENTION

The present invention relates to photovoltaic systems (PV systems) in the sense of sun-operated power stations, layout thereof and construction thereof and therefore the provision of a number of optional structures that allow an "optimization" in view of properties of the PV power station and no longer offer only a one-shot configuration.

BACKGROUND OF INVENTION

There are a large number of partly contradictory optimization objectives when constructing and designing photovoltaic systems for power generation. In order to provide a "good" photovoltaic system, a satisfactory compromise from various optimization objectives must be found.

However, existing software tools for the optimization of photovoltaic systems and the underlying concepts and methods follow a one-objective approach, as a result of which, by principle, they only assist the user of the software tool insufficiently with the configuration of the photovoltaic system. Furthermore, such approaches tend to divide optimization scope into individual criteria.

The basic principle of power generation in a photovoltaic system can be described as follows: photovoltaic modules convert incoming sunlight into direct current. Using "inverters" (which, in terms of function, are considered to be DC-AC converters, also in the sense of power inverters), this direct current is converted into an alternating current (of the locally used grid frequency, that is to say 50 Hz or 60 Hz) with higher voltage, and the current thus produced is fed after a further voltage increase by means of at least one transformer into the power grid of a local energy supplier. The locality concerns the location of the installation of the photovoltaic system (photovoltaic system).

The used PV modules (solar modules) are not assembled individually in the system area, but a relatively large number of PV modules are combined to form a relatively large module, or what is known as a "solar panel". A solar panel stands on a number of feet and for example can carry 100 PV modules, which are mounted on the solar panel in a number of rows, for example five rows, for example so as to form twenty modules in each case. The longer is such a panel, the more supporting feet it has, which can also be held in the transverse direction with struts in the manner of a base frame, or can carry the solar modules in the manner of 3D grid constructions.

Since the voltage supplied by an individual module is too small to be fed directly into a DC-AC converter, a number of modules are connected in series to form what are known as strings. By way of example, one solar panel would contain five strings each formed by twenty modules electrically connected in series, wherein the five strings could correspond to the five module rows of the panel. The strings of a panel are connected in parallel in the example. Lastly, a number of solar panels are connected in parallel to an input of a DC-AC converter (for example as an inverter or power inverter). Other electrical connections of the modules, for example in the form of a butterfly layout, are also possible. Here, two strings share two adjacent module rows in each case (in order to reduce the effect of shading).

Preferred voltage ranges of the multiplied DC voltage (multiplied by the number of modules per string) obtained in this way may lie above 500 V, preferably in the voltage range between 700 V and 1,500 V.

For improved utilization of the incoming solar radiation, the modules may be mounted not flat (horizontally) on the panel, but inclined by a certain angle of inclination from the horizontal in the direction of the equator, as can be achieved by different lengths of the supporting feet or of the base frame.

One (technical) problem is that of simplifying and therefore accelerating the construction of photovoltaic systems as a multiplicity of possible systems, or increasing the number of available (useful) system possibilities in a simple manner so as to have (many) more options with a selection and definition of the correct or well-suited PV system.

SUMMARY OF INVENTION

The solution can be found in the claims. It is a computer-assisted solution.

A method is proposed for defining a structure of a photovoltaic system in a given system area with a local given topology. The photovoltaic system comprises a multiplicity of solar panels, a plurality of DC-AC converters and at least one transformer station. The solar panels are electrically connected to the DC-AC converters by cabling. The plurality of DC-AC converters are electrically connected by cabling to the at least one transformer station. A multiplicity of adaptive blocks is used to define the structure from at least 80% of a nominal power of the photovoltaic system, and wherein each of the multiplicity of the adaptive blocks corresponds to a first system block. The first system block comprises the following components: a fixed number of solar panels and an arrangement of the solar panels in a fixed number of rows and columns, wherein the arrangement comprises a specification of row spacings between the rows, a first DC-AC converter, and an access from an edge of the first system block to the DC-AC converter. The method comprises the following steps: a) first placement of a block at a location in the system area with the local given topology; b) placement of further blocks at further locations in the system area without overlapping with blocks already placed previously; c) wherein, prior to a respective placement of a further block at one of the further locations in the system area, the row spacings of the solar panels of the respective further block are adapted to the topology given at the location of the placement of the respective further block in the system area, whereby an extension of the further block in the direction of the column of the solar panels of the further block changes; and d) ending the placement of further blocks if, by a placement of a further block, the nominal power of a photovoltaic system corresponding to the structure would be exceeded or if no additional block can be placed without overlapping blocks already placed previously.

An access is a passageway or path that makes it possible to reach a certain location, here the DC-AC converter in the multiplicity of solar panels of a block.

A computer-assisted multi-objective optimization of technical photovoltaic systems is thus made possible. The time taken to generate a wide variety of potential (useful) photovoltaic systems in an area to be developed (the system area) can be reduced.

With the available variety of layouts of producible photovoltaic systems, it is easier to determine the structure of the PV system that provides the best compromise from various optimization objectives.

In embodiments of the method, a further structure of the photovoltaic system is defined, wherein each of the multiplicity of the adaptive blocks corresponds to a second system block, and wherein the second system block comprises the following components: a fixed second number of solar panels and an arrangement of the solar panels in a fixed number of rows and columns, wherein the arrangement comprises a specification of row spacings between the rows, a second DC-AC converter and a second access from an edge of the second system block to the second DC-AC converter.

In this way, a system block different from the first system block can also be used.

In embodiments of the method, the multiplicity of adaptive blocks is used to define the structure from at least 90% to 95% of the nominal power of the photovoltaic system.

Thus, only minor manual post-structuring of the photovoltaic system is necessary.

In embodiments of the method, the photovoltaic system is restructured in a remainder up to 100% of the nominal power of the photovoltaic system with at least one partly adaptive block or with another block for completion of the overall structure.

It is thus possible to post-structure the already almost completely structure system.

In embodiments, at least some of the placed blocks are mirrored about at least one of the central planes of the corresponding system block before the corresponding adaptation of the row spacings.

This mirroring produces a different form of the system block, but leaves the components thereof unchanged.

In embodiments of the method, at least some of the blocks to be placed are sheared before the placement and before the corresponding adaptations of the row spacings.

With the shearing, the block is slanted from a rectangle into a parallelogram. In the then sheared form, the block is placed in a topology-dependent manner. This shearing produces another form of the system block, but leaves the components thereof unchanged.

In embodiments of the method, the row spacings are adapted with the aid of a shadow angle, which is equal for all adaptations of the placed blocks of the structure of the photovoltaic system.

This makes it possible to keep the shading of the panel rows of the solar panels uniform to a certain extent.

In embodiments of the method, the first system block and/or the second system block is/are L-shaped, or not all rows of the first system block and/or of the second system block are occupied fully by solar panels.

Further forms of system blocks can be attained in this way.

In embodiments of the method, a flat extension of the first system block and/or of the second system block is a rectangle.

Rectangular system blocks can be placed particularly advantageously automatically in a given system area.

In embodiments of the method, the number and arrangement of the solar panels of the respective system block with a given size of the respective system block also predefines uniform row spacings of the solar panels.

With the arrangement it is thus also possible to predefine which spacings the solar panels have per system block with predefined size of the system block and that these spacings are uniform.

In embodiments of the method, a respective structure is defined for a multiplicity of photovoltaic systems, wherein a plurality of technical variables of the each of the multiplicity of photovoltaic systems is determined in order to technically compare the multiplicity of photovoltaic systems.

The constructed layouts of the photovoltaic systems can thus be compared with one another easily.

In embodiments of the method, the multiplicity of photovoltaic systems can be stored in an accessible manner with their respective plurality of technical variables in a memory component so as to be presented graphically for a selection or a comparison with one another.

It is thus possible to read and graphically present this multiplicity of stored photovoltaic systems by means of a computing arrangement in order to facilitate the comparison.

In embodiments of the method, the first system block and/or the second system block is/are formed as a generator junction box (GJB) block, wherein a GJB block constitutes an assembly of solar panels, and wherein one of the solar panels of the assembly comprises a generator junction box, to which all solar panels of the assembly are electrically connected.

A GJB is a passive junction box that electrically conductively receives and electrically connects a multiplicity of DC input lines and provides a DC output line, which delivers the current sum of the input lines. The AJB (array junction box) is subordinate to these GJB blocks (and is arranged upstream thereof) and electrically combines a number of strings of a panel. A multiplicity of solar modules are connected in series in a string of a solar panel. A number of AJBs electrically supply a GJB.

Embodiments of the method comprise the following steps: forming a group of previously unassigned, placed blocks, placing a DC-AC converter instead of a solar panel in a respective formed group, and electrically connecting a block of each group to inputs of the DC-AC converter placed for the group until all placed blocks are grouped and electrically connected.

Furthermore, a method for constructing a system block for the above-presented method is proposed. A predefined DC-AC converter has a nominal power, from which the number of solar panels in the system block to be constructed is ascertained under consideration of a nominal power of a solar panel belonging to the system block.

Furthermore, a method for defining a structure of a photovoltaic system in a given system area with a local given topology is proposed, wherein the photovoltaic system comprises solar panels, cabling, DC-AC converters and at least one transformer station, wherein an adaptive block is used to define the structure from at least 80% of the given nominal power, and the adaptive block, as the first system block, comprises the following components:—a fixed number of solar panels and arrangement thereof in a fixed number of rows and columns; —only a first DC-AC converter; —an access from the edge of the system block to the DC-AC converter; the method comprises the following steps a) first placement of the first system block in the system area with the local given topology; b) multiple continued placement of the first system block in the system area, wherein the blocks placed in the system area do not overlap with blocks already placed previously; c) wherein, before a respective placement of at least some, preferably all first system blocks in the system area, the row spacings of the solar panels of the respective system block are adapted to the topology given at the location of the placement of the respective system block in the system area, whereby an extension of the placed system block in the direction of the columns of the solar panels of the system block changes; and d) ending the multiple continued placement of the first system block when a further placement exceeds the given nominal power or when no further system block can be placed in the system area without overlapping system blocks already placed.

In embodiments of the method, a further photovoltaic system is defined. The further photovoltaic system is defined in the given system area with the local given topology and comprises further solar panels, cabling, DC-AC converters and at least one transformer station. The method has the following further steps: a) first placement of the first system block in the (empty) system area with the local given topology; b) multiple continued placement of the first system block in the system area, wherein each block placed in the system area does not overlap blocks already placed previously, c) and at least one of the placements according to a and b is different from the corresponding placement for the first photovoltaic system; d) wherein, before a respective replacement of at least some, preferably all first system blocks in the system area, the row spacings of the solar panels of the system block are adapted to the topology given at the location of the placement of the system block in the system area, whereby an extension of the placed system block in the direction of the columns of the solar panels of the system block changes; e) ending the multiple placement of the first system block when a further placement exceeds a given nominal power of the photovoltaic system or if no further system block can be placed in the system area without overlapping with system blocks already placed.

In embodiments of the method for defining yet a further structure of a photovoltaic system, an adaptive block is used to define the structure from at least 80% of the system power as given nominal power. The adaptive block, as a second system block, comprises the following components: a fixed second number of solar panels and arrangement thereof in a fixed second number of rows and columns; only one second DC-AC converter; and a second access from the edge of the system block to the DC-AC converter.

The method has the following steps: a) first placement of the second system block in the (empty) system area with the local given topology; b) multiple continued placement of the second system block in the system area, wherein none of the blocks to be placed in the system area overlaps with any of the blocks already placed; c) wherein, before a respective placement of at least some, preferable all second system blocks in the system area, the row spacings of the solar panels of the system block are adapted to the topology given at the location of the placement of the system block in the system area, whereby an extension of the placed system block in the direction of the columns of the solar panels of the system block changes; d) ending the multiple placement of the second system block when a further placement exceeds the given nominal power or when no further system block can be placed in the system area without overlapping system blocks already placed.

In embodiments of the method for defining yet a further photovoltaic system in the given system area with a local given topology, which further system comprises solar panels, cabling, DC-AC converters and at least one transformer station, the method has the following steps. a) first placement of the second system block in the (empty) system area with the local given topology; b) multiple continued placement of the second system block in the system area, wherein the blocks placed in the system area do not overlap with blocks already placed, c) and at least one of these placements according to a and b is different from the corresponding placement for the yet further system; d) wherein, before a respective placement of at least some, preferably all second system blocks in the system area, the row spacings of the solar panels of the respective system block are adapted to the topology given at the location of the placement of the respective system block in the system area, whereby an extension of the placed system block in the direction of the columns of the solar panels of the system block changes; and e) ending the multiple placement of the first system block when a further placement exceeds a given nominal power of the photovoltaic system or when no further system block can be placed in the system area without overlapping system blocks already placed.

Furthermore, a method for defining a structure of a photovoltaic system in a given system area with a local given topology is proposed, wherein the photovoltaic system comprises: at least one transformer station, solar panels, cabling, a number of distributed DC-AC converters, each having a given number of inputs for DC current; wherein an adaptive block for defining the structure from at least 50% of the system power as given nominal power is used, and the adaptive block, as a first system block, comprises the following components:—a fixed number of (identical) solar panels, determined by the given number of inputs of one of the DC-AC converters (to be placed subsequently), the (known) nominal power thereof and the nominal power of a solar panel; —the arrangement of the panels in a fixed number of rows and columns.

The method comprises the following steps: a) multiple placement of the first system block in a system area with a local given topology, wherein the system blocks, as GJB blocks, placed in the system area do not overlap; b) wherein, before a respective placement of at least some, preferably all first system blocks in the system area, the row spacing or row spacings of the solar panels of the respective system block is/are adapted to the topology given at the location of the placement of the respective system block in the system area, whereby an extension of the placed system block in the direction of the columns of the solar panels of the system block changes; c) ending the multiple continued placement of the first system block when a further placement exceeds the given nominal power or when no further system block can be placed in the system area without overlapping with system blocks already placed; d) multiple group formation of previously ungrouped, placed GJB blocks, placement of a DC-AC converter instead of a solar panel in a respective group, and electrical connection of the GJB blocks of the group to the inputs of the respective placed DC-AC converter, such that each input is electrically conductively assigned to a GJB block until all placed GJB blocks are grouped and electrically connected.

In embodiments of the method, the definition of the structure from at least 80% of the system power is used as given nominal power.

In embodiments of the method, the definition of the structure from practically 100% of the system power is used as given nominal power, and therefore practically the entire system is constructed by placement of system blocks in the system area.

In embodiments of the method, the remainder of the system up to 100% of the system power is post-structured with at least one partly first system block in order to complete the overall structure.

In embodiments of the method, at least some of the blocks to be placed are mirrored about at least one of the central planes of the first system block as an as yet unplaced GJB block, prior to the corresponding adaptation of the row spacing or row spacings of the placed GJB block.

In embodiments of the method, the respective system block is sheared prior to least some placements and the corresponding adaptations of the row spacings and is then placed in sheared and topology-adapted form in the system area.

In embodiments of the method, the row spacing or row spacings is/are adapted with the aid of the shadow angle, which is identical for all adaptations of the system blocks placed in a topology-dependent manner for a photovoltaic system structure.

In embodiments of the method, the first system block is L-shaped.

In embodiments of the method, a flat extension of the first system block is a rectangle.

In embodiments of the method, the number and arrangement of the solar panels per system block with given size of the GJB block also predefine at least one uniform spacing of the solar panels in the column direction.

In embodiments of the method, the structure of a multiplicity of photovoltaic systems is defined, and technical variables of each system are determined so as to make these systems technically comparable.

In embodiments of the method, the multiplicity of photovoltaic systems are stored in an accessible manner with their respective technical variables in a memory component so as to be presented graphically for a selection or a comparison with one another.

Furthermore, a method for GJB system block construction for the above-mentioned method is proposed, wherein a predefined DC-AC converter has a nominal power and the number of solar panels in the first system block as GJB block is ascertained from this under consideration of the nominal power of a solar panel.

Furthermore, a method for defining a structure of a photovoltaic system in a given system area with a local given topology is proposed, wherein the photovoltaic system comprises: at least one transformer station, solar panels, cabling, a number of distributed DC-AC converters, each having a given number of inputs for direct current; wherein an adaptive block for the definition of the structure from at least 50% of the system power as given nominal power is used, and the adaptive block, as a first system block, has a fixed number of (identical) solar panels and the arrangement of solar panels in a fixed number of rows and columns.

The method has the following steps: a) multiple placement of the first system block in a system area with a local given topology, wherein the system blocks, as GJB blocks, placed in the system area do not overlap; b) wherein, prior to a respective placement of at least some, preferably all first system blocks in the system area, the row spacing or row spacings of the solar panels of the respective system block is/are adapted to the topology given at the location of the placement of the respective system block in the system area, whereby an extension of the placed system block in the direction of the columns of the solar panels of the system block changes; c) ending the multiple continued placement of the first system block when a further placement exceeds the given nominal power or when no further system block can be placed in the system area without overlapping with system blocks already placed; d) multiple group formation or previously ungrouped, placed GJB blocks, placement of a DC-AC converter instead of a solar panel in a respective group and electrical connection of a GJB block of each group to the inputs of the DC-AC converter placed for the group until all paced GJB blocks are grouped and electrically connected.

A computer-assisted multi-objective optimization of (technical) photovoltaic systems is thus possible. The time taken to generate a wide range of potential (useful) photovoltaic systems in an area to be developed (the system area) can be reduced.

With the available variety of layouts of producible photovoltaic systems, it is easier to determine the structure of the PV system that provides the best compromise from various optimization objectives.

The starting point and objective of the photovoltaic system is the outline of an area (as system area), wherein the compass direction "north" is usually drawn (oriented) upwardly.

With the claimed computer-assisted placement of system blocks (and the construction in the system area of the panel groups thus arranged, corresponding to the system blocks), different spacings between the panel rows of the solar panels in the north-south direction (that is to say in the direction of a respective column of the solar panels) are produced in accordance with the claimed invention. These result from the area topology of the system area taken into consideration with the placement of the system blocks and comprising locations with an incline of different magnitude in the north-south direction or plateaus (flat locations with no incline).

In order to keep a shading of the panel rows of the solar panels uniform to a certain extent, panel rows with an arrangement in the Northern Hemisphere are placed far from one another in flat locations of the system area or even further from one another with slopes slanting northward, and panel rows on southern slopes are placed closer together. This involves a change of the spacings between panel rows in the case of the placement of a respective system block.

The claimed method defines the structure of a photovoltaic system. This system is placed in a given system area, wherein this system area has a given (local given) topology for the system area. This means the topology of the total system area in which the photovoltaic system is erected.

A photovoltaic system typically has a multiplicity of solar panels, a wired connection from each solar panel to a DC-AC converter (usually an inverter or power inverter), and the plurality of inverters placed on the system area have an electric wired connection to at least one transformer station. The hierarchy of the solar modules on the solar panels is thus, from bottom to top, the module, the string (on the panel), the combination of the strings to form an electrically active solar panel, the combination of a number of solar panels to form a DC-AC converter, wherein all solar panels that are electrically conductively assigned to the same converter are referred to as a group, otherwise considered as an inverter area. The connecting cabling of the number of inverters, wherein each inverter has its inverter area on solar panels, is based on the concept that the energy already converted to alternating current is fed to the transformer station, which causes an increase of the voltage, but no change to the frequency. The output of the photovoltaic system is the output of the transformer station, which is connected to the medium-voltage or high-voltage synchronous grid with the "local frequency", which may vary depending on the location of the installation of the photovoltaic system. Accordingly, the converters from DC to AC are also equipped such that they also convert the solar power to this frequency.

An adaptive block is used in accordance with the invention to structure the system or to create the structure of the constructed system.

This adaptive block defines the structure from at least 80% of the system power. A higher percentage of the system power compared with the nominal power given for the structuring may also be defined.

Usually, however, the entire system is not defined using the adaptive block, but instead at least one residual element remains, which can be placed manually in order to reach the predefined system power accurately. In other words, the nominal power of an adaptive block does not have to correspond to an integer multiple of the system power, but instead a (low) residual power may remain, which is supplemented and completed by a post-structuring.

The adaptive block may be provided as a first system block. A number of system blocks or other system blocks may also be used when other structures of photovoltaic systems are to be defined in the same system area.

The system block is firstly to be defined. As illustrated clearly in FIG. 3, the system block has a fixed (or given) number of solar panels. The arrangement thereof in the system block is also predefined. The arrangement consists of columns and rows. The system block is no longer provided as a converter for the conversion of direct current (DC) to alternating current (AC). In addition, a track is provided, which gives access from the edge of the system block to the DC-AC converter.

The definition of the system block can be interpreted clearly as a rectangle. However, other forms of system blocks are also possible. The L-shape defined there also allows a structuring of the system with L-shaped system blocks. The primary application, however, is the simplified rectangular (or square) form of the system block. The system block defines a planar extension, which is suitable for receiving the fixed number of solar panels, the access and the converter. Spacings between the rows formed by the solar panels, these spacings being known as row spacings, are thus also predefined. They may be uniform in the system block. A number of solar panels, for example two, three or four solar panels, can be placed along a row. The converter is usually arranged in the central region of the system block and is placed at a location where a panel is missing in the row.

In addition to the number and the arrangement of solar panels, the spacings between the solar panels per system block with predefined size of the system block and the fact that these spacings are uniform can thus also be predefined with the arrangement.

If a system block is defined, it is placed, more specifically a number of times. A first placement of the system block occurs at any location of the system area. This system area has the previously postulated topology. The system block is then placed a number of times and in a continued manner. During the placement, the system block experiences an adaptation to the topology. A distinction is therefore to be made between the system block and the topology-adapted system block, which is actually placed. If reference is made to the placed system block, it is inherent in the system that this system block has experienced an adaptation determined by the topology at the location of which the system block is placed. The block may thus lengthen or shorten, and the row spacings in the block are no longer uniform or identical, but also change in accordance with the topology. If the topology is flat, the block does not change and the predefined components of the system block remain unchanged. If the topology consists of various inclines, the spacings between the solar panels and specifically the row spacings of each solar panel row to the next solar panel row are adapted in accordance with the incline.

Here, it is not the row spacing of each column that changes, but always a row on the whole with respect to the next row (overall). Therefore, reference is made to the column direction and to a row spacing, which changes in the column direction.

The blocks do not overlap with the placement. Each placed block (each topology-adapted block, which is placed in the system area) does not overlap with a block already placed.

The adaptation occurs prior to the respective placement, but after the definition of the respective system block. The system block remains the same for a system in the system area. The respective change to the system block, which change adapts to the topology in which the system is placed, does not remain the same. These specifications are sufficient for a computer-assisted placer, such that the placer performs each placement of a system block such that it does not overlap with a block already placed and at the same time the topology data of the block to placed are used in order to change the extension of said block prior to the placement in the direction of the columns of the solar panels. The system block is thus controlled in terms of spacing in the column direction by the topology known in the system area.

The multiple placement (and previous adaptation of the system block prior to the placement) is ended when no further placement in the given system area is possible (without overlap), or the given nominal power of the currently constructed photovoltaic system is reached. The reaching of the given nominal power is to be understood to mean that this power is not to be exceeded. This power does not have to be reached precisely, but the reaching of the power can also be defined in the sense that a renewed placement of a system block would exceed the predefined nominal power. This is interpreted as a termination criterion by the placer, which has then performed its task. If the system area, however, is not completely covered and the nominal power has already been reached, the placer may also terminate its automatic placement, that is to say there is no need for a manual input.

Controlled by the defined criteria, it is possible in an automated (computer-controlled) manner for the placer to place the system block predefined to said placer as often in the system area as required by the system power.

A post-correction in the sense of a post-structuring when a part of the system area remains open and part of the system power is still missing is possible, manually but also in a computer-assisted manner.

It has already been mentioned that another system block can also be used. This other system block is generated by a system block generator and is predefined to the system block placer. The system block placer then places another predefined system block, which also comprises the fixed number of solar panels, arrangement thereof in a fixed number of rows and columns, the converter and access to the converter from the edge of the second system block. At least one of these parameters of the second system block is different from the first system block. The second number of solar panels specified there and the second converter and the second access do not necessarily all have to differ, but just one of these parameters of the second system block must differ from the first system block in order to distinguish it. By way of example, another nominal power of a converter may be used, another position of the access may be used, and another number of solar panels may be used, as may another spacing or even other solar panels with a different nominal power. At least 80% of the nominal power of the system can also be fulfilled with the second system block. A further approximation of 100% of the nominal power of the system is also possible.

If the same system block is used for a further system, this system block with a different starting point can be placed differently from the same block for the previous system. The system area will have been emptied again for this purpose, that is to say the start of the placement of a new system, which is to be fitted into the same local given topology and has the same system area, but will provide a different result. A different placement of the same system block follows for this purpose. A different start is one possibility for different placement, because the automatic placement in the next steps of the multiple continued placement of the first system block is adapted to the initial differently selected placement, and consequently a different system is created. The end is the same, that is to say the automatic placement is ended when no further overlap-free placement of the system block is possible, or the system power is already reached and the system area could not yet be filled completely. The termination criterion that the given nominal power of the photovoltaic system would be exceeded with the next placement of a system block is to be interpreted such that this power is at least 80% of the system power provided for automatic occupancy. If more than 80% can be filled, for example 90% of the system power, the termination criterion is thus also this 90% of the system power. The two capacities do not correspond to one another. They both correspond to the full nominal power when no post-structuring of the photovoltaic system is performed, is to be performed or has to be performed.

The feature that at least one of the placements (feature a and feature b) is to be different is to be interpreted in view of the corresponding placements of the first photovoltaic system. The second placement may be different, the first placement may be different, or each placement may be different, that is to say both the first placement and all following placements. However, it may be that only the last placement is different, which will occur rarely however if all prior placements were the same and the automatic placement functions automatically.

The other result is easier to see when a second system block is used, which deviates from the first system block in terms of at least one of its parameters.

A different system is thus created. The combination of the methods according to original claims 1, 2 and/or 3 provides a multiplicity of differently structured systems, which are not produced merely with different system blocks, but are also created by a different type of placement with the same system block.

If a different placement is selected for the second system block defined initially (feature b), this other placement is thus to be seen with a view to the placement of the system first created with the second system block. If further other placements are triggers of yet further structurings of systems, the other placement naturally must be different from all systems created previously with the same second system block. Otherwise, there would be no different systems with a different structure that are to be stored for a subsequent selection and optimization.

The claims have been drafted such that in any case some, preferably all system blocks (first or second system block) are adapted in terms of the row spacings for the placement in a manner controlled by the topology or are otherwise changed in a manner dependent on a topology of the location at which the system block is placed, such that, with the placement, the system block has a different extension compared with the starting block (the system block itself).

The entire system with the entire power is preferably constructed adaptively, such that all system blocks are adapted in a topology-dependent manner. However, if the topology is flat and a large number of the placements require no topology-based adaptation, this is also to be included by the claims as an adaptation that is zero in terms of the result because the extension of the block remains unchanged. An adaptation of the system block in the case of a flat area, in which the system block is placed, is not a change, and therefore the extension of the placed system block does not change. If a user, however, knows that certain regions of its area are flat, it could prompt the system and the auto-placer to perform no topology adaptation in this area at all, such that a change-free result is produced, in order to avoid the wording of the claims. The fact that at least some, preferably all system blocks are adapted in a topology-dependent manner is therefore included. This occurs before the system blocks are placed.

The system blocks can also be adapted differently. The system block can be mirrored about at least one or both central planes. This mirroring produces a different form of the system block, but leaves the components thereof unchanged. This mirroring is implemented prior to the placement and prior to the corresponding adaptation of the row spacings under the influence of the topology of the area in which the (mirrored) system block is placed.

Yet a further adaptation of the system block is a shearing. With the shearing, the block is slanted from a rectangle into a parallelogram. The block is then placed in sheared form in a topology-dependent manner.

The adaptation of the blocks in this form is adapted to the surface that is to be filled. If one of the delimiting lines of the system area is inclined, the automatic placement may mean that the block resting there against the edge is also inclined, which has an effect on following placements. The system block is therefore a type of template, pattern or stamp, which is implemented, however this stamp is not constant, but is controlled by the system area in which it is placed during the placement.

The system block can be mirrored about one or two central planes in order to make the access suitable. If an access in a side direction is provided (from the edge of the block to the DC-AC converter), it may be for placements that at least one system block is to be placed in mirrored form, such that the transversely arranged accesses from adjacent rows of placed system blocks can lead to the same bus path, which can be placed subsequently between the rows of the placed blocks.

This means that the automatic placement will lead to the structure of the photovoltaic system, however this system thus structured is not yet fully complete, but rather can also be supplemented by manual subsequent improvement procedures or supplemental procedures, also including the ultimately complete occupation or connection of all paths or bus path connected to the accesses or reached from the accesses.

Here, the paths or accesses are used either to navigate through the system, to walk along the system or to guide current-carrying cables/lines, which are to be laid along these paths. Accordingly, the access to the converter in a respective system block is also to be understood as a track of the type that either allows navigation or is available only as a cable path.

The electrical cabling of the structured system may also be performed following the placement of all system blocks. This cabling itself is not expressly part of the first system block or of the second system block and also is not defined with the placement of these system blocks.

The result of the placement with the system blocks is a photovoltaic system of which the structure is stored. The multiplicity of stored systems, which can be obtained quickly and in an uncomplicated manner with the claimed method, represents the multiplicity of possibilities offered for a system area.

Here, the definition of the structure is the essential and crucial starting point, and the subsequent post-processing via the described paths or the electric cabling is rather of secondary nature. This emerges relatively clearly from the structure of the system thus constructed. A system constructed in this way may also already have some technical variables. Other additional technical variables are supplemented by the subsequently laid electrical lines and the connections of the solar panels to the inverters.

These technical variables make one constructed system comparable on the whole with another constructed system which can be constructed in the same system area. This technical comparison of systems makes is possible to place and actually define the system in the best possible way for the application so as to be able to also construct said system. The technical comparison determines this system.

In order to compare them (the systems), they are stored together in a memory component, usually a database. A computer arrangement is then able to read and graphically present this multiplicity of stored photovoltaic systems in order to facilitate the comparison.

According to the definition of the claims, a system block is a block that defines an inverter area. The system block is assigned a DC-AC converter, and all solar panels in the system block are electrically connected to this DC-AC converter. Considered conversely, the system block is an inverter area. The system block can thus be defined on the basis of the nominal power of this DC-AC converter, the number of solar panels predefined in the system block, and further takes into consideration the nominal power of a solar panel in the system block.

If the structure size is decreased to a further extent (discretization), the number of defined components of a system block is thus reduced to a GJB block (the electrical scope of a junction box), and therefore a DC-AC converter is no longer necessarily assigned to a respective GJB block, which may also be formed as an adaptive block.

This block, as a further solution to the same problem, is determined by a number of solar panels, a number of inputs of a DC-AC converter to be placed subsequently, the nominal power thereof and the nominal power of a solar panel. The arrangement of the panels in a fixed number of rows and columns is also predefined.

This GJB block, as a system block, does without a predefined DC-AC converter, but defines a group of solar panels, which are electrically assigned to a junction box "GJB" (understood on the basis of the specialist term). The GJB box is a connection box conventional in the specialist field for a multiplicity of electric lines from a multiplicity of solar panels, fed via the GJB block to an inverter. Only later is one of the solar panels in a larger group of placed GJB blocks removed and a DC-AC converter (inverter) is placed at its location, to which all lines from the GJB blocks are electrically conductively fed.

A GJB is a passive junction box, which electrically conductively receives and electrically connects a multiplicity of DC input lines and also provides a DC output line, which delivers the current sum of the input lines. The AJBs (array junction boxes), which electrically combine a number of strings of a panel, are subordinate to these GJB blocks (and are arranged upstream thereof). A multiplicity of solar modules are connected in series in a string of a solar panel.

A number of AJBs electrically supply a GJB, and, as described above in the case of the inverter area, the GJB area is that which can also be placed (claim 20), but has a smaller nominal power than the first or second system block in each case with an inherent DC-AC converter.

A number of GJBs may also be connected to the same input of an assigned DC-AC converter.

Due to the multiplicity of the degrees of freedom, there is a wide range of potential PV systems in a system area to be developed. Here, the individual systems behave differently in respect of different, decision-relevant technical properties, which often correspond directly to the optimization objectives (by being maximized or minimized).

Here, by way of example, the (technical) nominal power of the system, the (technical) annual yield (produced energy in kWh—kilowatt hours), the technical outlay (number of required components, complexity of the wiring) and the outlay with the assembly and maintenance of the system (robustness or sensitivity) can be cited.

The magnitude of the individual technical properties (and therefore the satisfaction of the optimization objectives) of a photovoltaic system is dependent here in a complex manner on technical parameters. The technical properties are additionally influenced by the topology (ascending or descending slopes) of the system area, the course of the sun, corresponding to the latitude at the location of the specific area, and the typical weather conditions over the area.

It can be said that the optimization of a photovoltaic system is characterized by a large range of possible technical parameters (properties), various ambient influences, and complex dependencies between the degrees of freedom. Therefore, the builder, designer and planner of a photovoltaic system require good assistance.

Due to the generation of a variety of photovoltaic systems covering the range of possible solar power stations in the system area, the optimization scope is demonstrated in the form of individual technical properties, and an overview of immediately available alternatives is obtained.

The claimed inventions will be explained and supplemented hereinafter on the basis of a number of exemplary embodiments.

BRIEF DESCRIPTION OF THE DRAWINGS

FIG. 1.1 shows a perspective illustration of a panel $T_1$, which comprises a multiplicity of solar modules 21, 22, 23, etc. on a supporting frame, wherein the entirety of the coverage with solar modules is denoted by 20.

FIG. 1.2 shows a side view of FIG. 1.1, wherein two tables $T_1$ and $T_2$ are illustrated in a manner distanced to the right, and the distance is denoted by d. In an alternative, with a modified course of the terrain from $B_1$ to $B_2$, a second panel $T_2$ is arranged lower, represented by just the lower end of its supporting foot $t_2'$ and distanced further from the first panel $T_1$, characterized by the distance d', than the panel $T_2$, which is placed on flat terrain $B_1$ and is arranged at the shorter distance d from the table $T_1$.

FIG. 2.1 illustrates a multiplicity of system blocks, which are all created from the same system block $S_1$ and, with placement, have been inserted into the system area according to FIG. 2. The individual system blocks in the placed form do not overlap and practically completely fill the area consisting of two rectangles, with a respective distance between the blocks, in which tracks can be placed which are formed as navigable paths or as cable paths (in the sense of: tracks).

FIG. 3 shows an example of a system block comprising four columns and eleven rows of solar panels, wherein a DC-AC converter is shown at the location of a solar panel approximately in the middle of the system block.

FIG. 3.1 shows the block according to FIG. 3 in a version sheared by the angle α.

FIG. 3.2 shows the system block mirrored about a central plane (the central plane runs along the access Z).

FIG. 7 is only the first portion of the following FIG. 8 (in the top left-hand portion of FIG. 8).

DETAILED DESCRIPTION OF INVENTION

Figure 1:
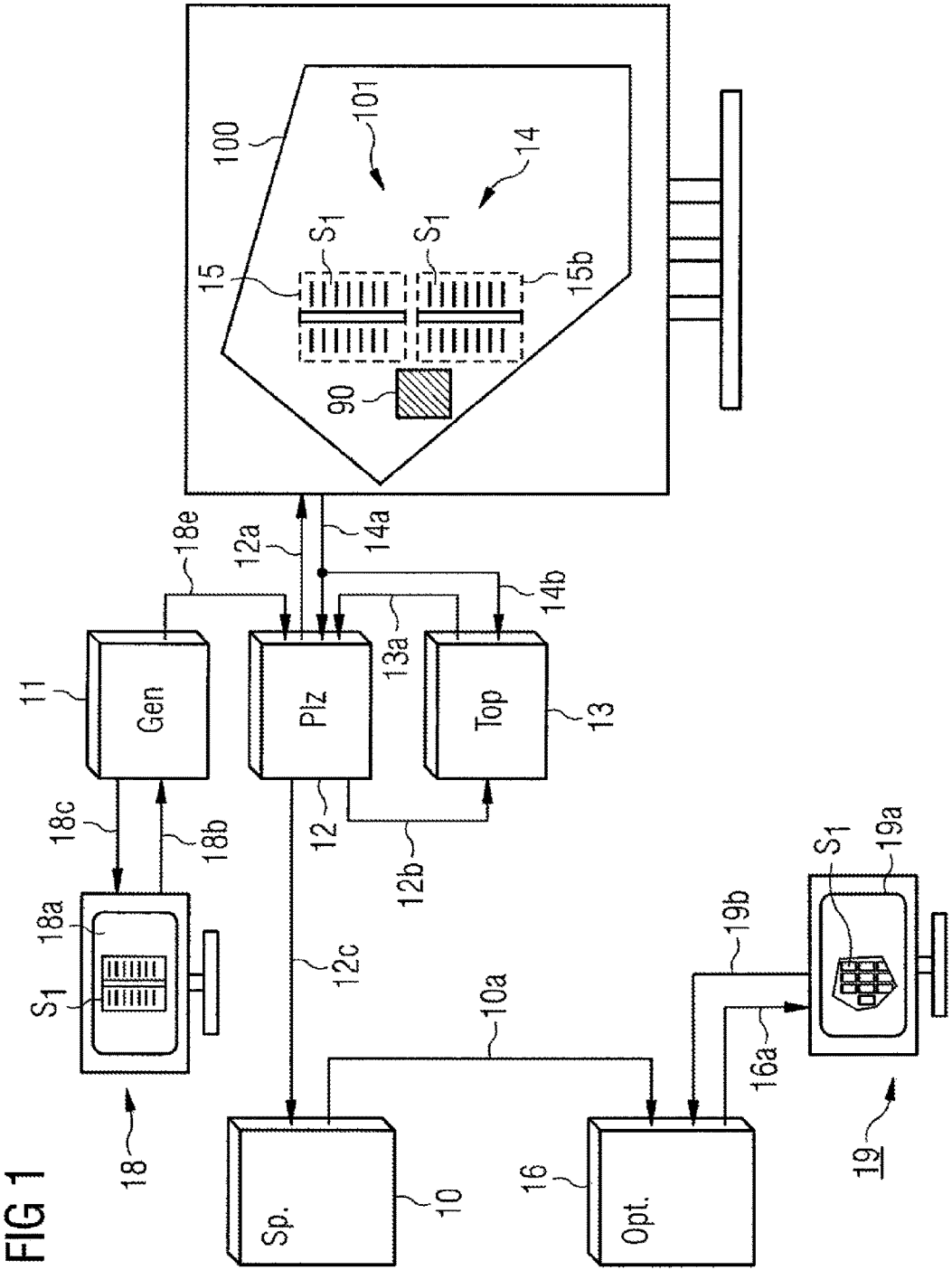
FIG. 1 shows a layout of a system comprising a computer with a memory and a number of presentation arrangements.

FIG. 1 shows a memory module 10, in which a multiplicity of layouts of photovoltaic systems are stored digitally. This memory can be formed for example as a database. The layouts, stored in the memory, of photovoltaic systems 101, 102, which will be explained later and which have been constructed in a "computer-assisted" manner in this example by at least one first computer 12, are read by a second computer 16 and are presented on an on-screen presentation 19a of a presentation arrangement 19.

The on-screen presentation 19a, which may be a printout or a presentation on a display, may have at least two highlighted regions, a coordinate region and an axis region, in which a multiplicity of parallel axes, illustrated as graphically represented sliders (axis with graphic slide buttons) are plotted.

FIG. 1 is a diagram with which the function is to be made understandable. To this end, individual functional components of the method as a whole are subdivided, assigned to dedicated computer cores and also shown on different presentation arrangements, of which three presentation arrangements 18, 19 and 14 are illustrated in FIG. 1.

Essentially, all method functions, which will be explained hereinafter, can also be performed with one computer and one primary memory 10 (which may be a database), if one presentation arrangement, for example 14, is provided for this purpose. However, the function of the individual elements of this overall system (the system) is not clear as a result, and therefore these will be considered individually by way of example and so as to encourage understanding.

With an explanation of this function, it is already assumed that the procedure is denoted or performed in accordance with the following pages. The system itself cannot be understood unless the procedure is understood. This anticipation of the more detailed explanation to follow subsequently may therefore provide an insight or an overview.

A first system block $S_1$ is shown on the first presentation arrangement 18, which may be a screen or a beamer, which projects the content of a screen onto a projection surface. This system block $S_1$ is generated by a computer 11, referred to as the system generator. The computer 1 supplies the on-screen presentation 18*a* on the presentation arrangement 18 with an image of the currently active system block $S_1$.

The system generator is also used within the scope of interactive handling to generate other system blocks by means of pointers (mouse pointers) or during the course of an interactive tablet presentation by means of contact when elements of the system block $S_1$ change. This is communicated by the presentation arrangement 18 via a connection 18*b* to the system generator 11, which then changes the presented system block via the display line 18*c*.

The system generator 11 feeds the current system block $S_1$ via the line 18*e* to the system block placer 12, which has a core task of the overall system. The system block placer PLZ or 12 uses the system block from the system block generator 11 and places it on a further presentation arrangement 14, which symbolically illustrates or displays a system terrain 100, wherein other alternatives of the presentations can also be used here, such as a beamer onto a projection surface, which is even recommended in the case of a large system area.

A transformer station 90 is symbolized in the system area 100, and two placed system blocks $S_1$ can already be seen schematically, which are identified here by way of example in the top left-hand corner point. The first corner point 15 is placed first.

By way of example, a mouse pointer or a coordinate input can be used for this purpose, and this placement and the location at which the first placement 15 occurs are communicated from the display arrangement 14 via the line 14*a* to the system block placer 12. This then places the system block $S_1$, which it has obtained from the system generator 11 via the line 18*e*, at this location, as is indicated symbolically.

All further system block placements are computer-assisted and are performed automatically by the system block placer 12, such that the placer point 15*b* (upper left-hand corner point of the system block as second-placed block) does not have to be predefined additionally. The computer 12 finds this itself.

The starting point 15 is also conveyed to the topology memory TOP or 13, in addition to the system block placer 12, via the line 14*b*. This topology memory then delivers the terrain configuration, hereinafter the topology, around the point 15 to the system block placer 12 via the line 13*a*.

The system block placer 12 thus allows the system block $S_1$ to be placed, which it has obtained via the line 18*e*, to be converted under consideration of the topology at the first placement point 15 and thus placed, as is shown symbolically in the presentation arrangement 14 and display thereof, within the system terrain 100. The further placement of the following system blocks, in the example with the upper left-hand corner 15*b*, which the system block placer 12 finds itself, is performed under consideration also of the topology beneath the second placement point 15*b*. The system block placer also obtains this topology information via the topology line 13*a*, but requested from a system point, which a user has not predefined by 15, but which has been calculated by the computer unit 12 itself (system point 15*b* in the example) and has been communicated via the request line 12*b* to the topology memory 13.

This is read and outputs the topology at the second placement point 15*b* to the system block placer 12 via the line 13*a*.

The illustrated corner is just one example of a possible placement. Other examples may be the middle of a system block $S_1$ to be placed or other corners or edge lines. The location thus identified is initially known to the system block placer 12 and the topology memory 13, such that on the one hand the placement is performed correctly and on the other hand the associated topology in the portion of the system block to be placed is also fed correctly via the line 13*a* to the system block placer 12.

The calculation of the placement in the system block placer will be disclosed in greater detail in the following paragraphs of the application.

That which occurs with these system blocks once the system area 100 has been filled should also be mentioned. The system block placer 12 has a buffer, in which it temporarily stores the placed blocks and coordinates thereof. If the system area 100 is filled or if it is filled such that the nominal power of the systems currently being designed is reached, the system configuration or the structure of the system thus formed, in the example 101, is stored in the primary memory 10 or SP.

In this way, a multiplicity of structures of photovoltaic systems can be constructed with cooperation of the three central components 11, 12 and 13, and can be stored in the central memory 10. They are available there collectively and can be used by a computer core 16, not explained here in greater detail, which deposits these various systems, for optimization or for selection or even just for presentation thereof, in a further display screen 19, or deposits them in a suitably modified manner so as to find and place a realistic system for the area 100 from the many possible systems. To this end, the optimization OPT in the computer 16 has an input line and an output line. The multiplicity of stored system configurations are fed to the optimization via the input line 10*a*.

By means of the output line 16*a*, the optimization presents these system configurations suitably on the display screen 19. There, a filled system area 100 is presented symbolically, in which a multiplicity of system blocks $S_1$ are already placed, however this is only one possible presentation mode, and many other possible presentations are possible, but will not be explained here in greater detail. One possible way of presenting the many system configurations and making a multi-objective selection therefrom in accordance with a number of optimization criteria is disclosed in application DE 10 2011055 849.7 of 29 Nov. 2011, the content of which is incorporated here, in so far as there are questions concerning the graphically controlled selection from previously stored system configurations (there from the memory 30, here from the memory 10).

The optimization in the computer core 16 is controlled via the line 19*b*, which transmits signals, activated by mouse pointers, or transmits control signals to the computer 16 by means of keyboard inputs (not illustrated).

In the presentation arrangement 19, the graphical display region 19*a* is illustrated, but may also be a beamer presentation onto a projection surface, or a tablet, in which case the display itself can be modified by haptic use and input signals are to be provided.

The use of the system thus described will be explained in greater detail hereinafter. Before this, a further basis will be explained, which concerns the solar panels to be placed.

Figure 4:
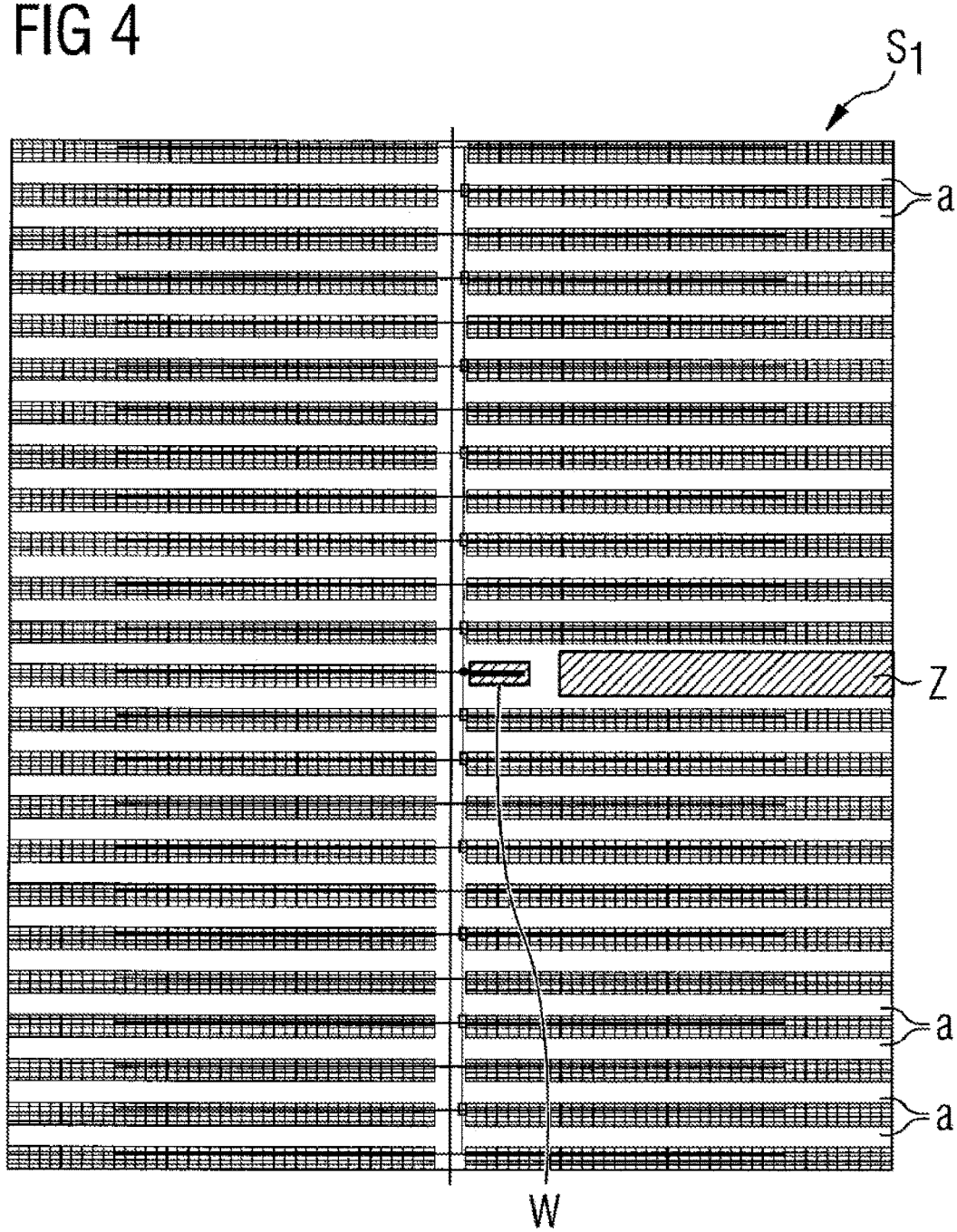
FIG. 4 illustrates in greater detail the number of solar panels and a system block specified in greater detail, in which the components from FIG. 3 are also visible, only illustrated as far as the modules of a panel, which are visible as small rectangles. Electrical lines which connect the panels to the converter are also illustrated.

Here, it has already been assumed in FIG. 1 that the system block configuration, as is shown by way of example in FIG. 3 or FIG. 4, is familiar. In this system block configuration, a multiplicity of solar panels are placed, of which one is shown in an inclined view in FIG. 1.1, and two spaced solar panels are illustrated in section in FIG. 1.2. Each rectangular bar in FIG. 3 corresponds to a solar panel, wherein the reference signs $T_1$ and $T_2$ may stand for the solar panels $T_1$ and $T_2$ in FIGS. 1.1 and 1.2.

The solar panels $T_n$, which in the example are illustrated as two panels $T_1$ and $T_2$ in FIGS. 1.1 and 1.2, are those that carry a multiplicity of solar cells 20 on a surface. These solar modules 21, 21a, 21b, ..., 22, 22a, ... may be organized differently. Currently conventional organizations are arranged such that a number of rows 29, 29a, 29b, 29c, 29d of solar modules are organized and are placed on the upper side of the panel $T_1$ so as to cover the surface thereof. They are electrically connected on the underside, either all solar modules in a row being connected in series or alternately by interleaving different modules from adjacent rows 29, 29a and series formation. Columns 21', 22', 23', ... of solar modules are produced in a direction perpendicular thereto.

The delivered voltage of each solar module 21, 22, 23, ... can thus be added, such that a voltage is produced along a "string", for example 21 or 21a, and corresponds to the inherent voltage of a module, multiplied by the number of modules connected in series. The DC voltage thus formed, which is not altered by parallel connection of the number of strings, but is only increased in terms of its deliverable current, is not above 1,500 V in currently conventional systems. It is a DC voltage that is generated by the incident solar energy.

The various rows 29, 29a, 29b (and others) are placed in the illustrated example on an inclined surface. This inclination may be of differing size depending on the location of installation of the photovoltaic system. It may also be close to 0° when the solar panels T are installed in the vicinity of the equator. It preferably has a small angle of inclination so as to counteract damage during use and for example so as to allow water to run off. The further north the solar system is placed, the greater is the inclination θ (theta) which all solar cells 20 on the flat side of their solar panel have with respect with the horizontal H.

If the system is installed close to the equator, an angle of inclination close to 0°, usually above 10°, is used so as to attain a self-cleaning effect when water hits the solar cells 20 and should run off.

Systems that are installed further north have a greater angle of inclination between 40° and 50° for photovoltaic systems that are equipped with solar panels according to FIGS. 1.1 and 1.2 and for example are installed in Sweden (>60° north). In central Europe with a latitude of between 45° and 55°, the angle of inclination of the solar surface 20 will be between 20° and 40°. Specifically, a range around 30° inclination (±10% deviation) may be suitable for Munich (approximately 48° latitude).

The solar surfaces 20 are oriented here in a southern direction (toward the equator) and preferably have the same inclination throughout the photovoltaic system. This inclination constitutes a technical property value, which can be supplemented by the shade angle (shadow angle) σ (sigma), which may also be the same for an entire system. This angle is represented in FIG. 1.2 and passes from the upper edge of one panel to the lower edge of the following panel $T_z$. The distance between the two panels $T_1$ and $T_2$ illustrated in FIG. 1.2 is defined by this angle and is also dependent on the way in which the topology changes.

The solar surface structure mounted on a frame with the solar cells 20 stands either on a number of feet or on a frame that is also stabilized in the transverse direction by cross-pieces $q_1$. The two feet $t_1$ and $t_2$ illustrated by way of example contribute via their different length to the angle of inclination θ (theta).

If the course of the terrain B1 changes in an area to be occupied, as is illustrated in FIG. 1.2, the distance between the panels also changes in a manner predefined by the shade angle σ (sigma). The next panel is placed at a distance d' when the terrain changes downward, as is illustrated by $B_2$. The associated foot $t_2'$ is lower and, due to the predefined shade angle, the distance d' changes compared with the shorter distance d when the terrain $B_1$ remains at the same height.

The individual solar panels are electrically connected by electric cables, usually made of aluminum. The modules of each panel are connected via dedicated cables or lines of the strings to an AJB (array junction box), and a plurality of these array junction boxes are electrically interconnected at a GJB (generator junction box). This is connected to the inverter as DC-AC converter, to which the group of solar panels is assigned.

Figure 2:
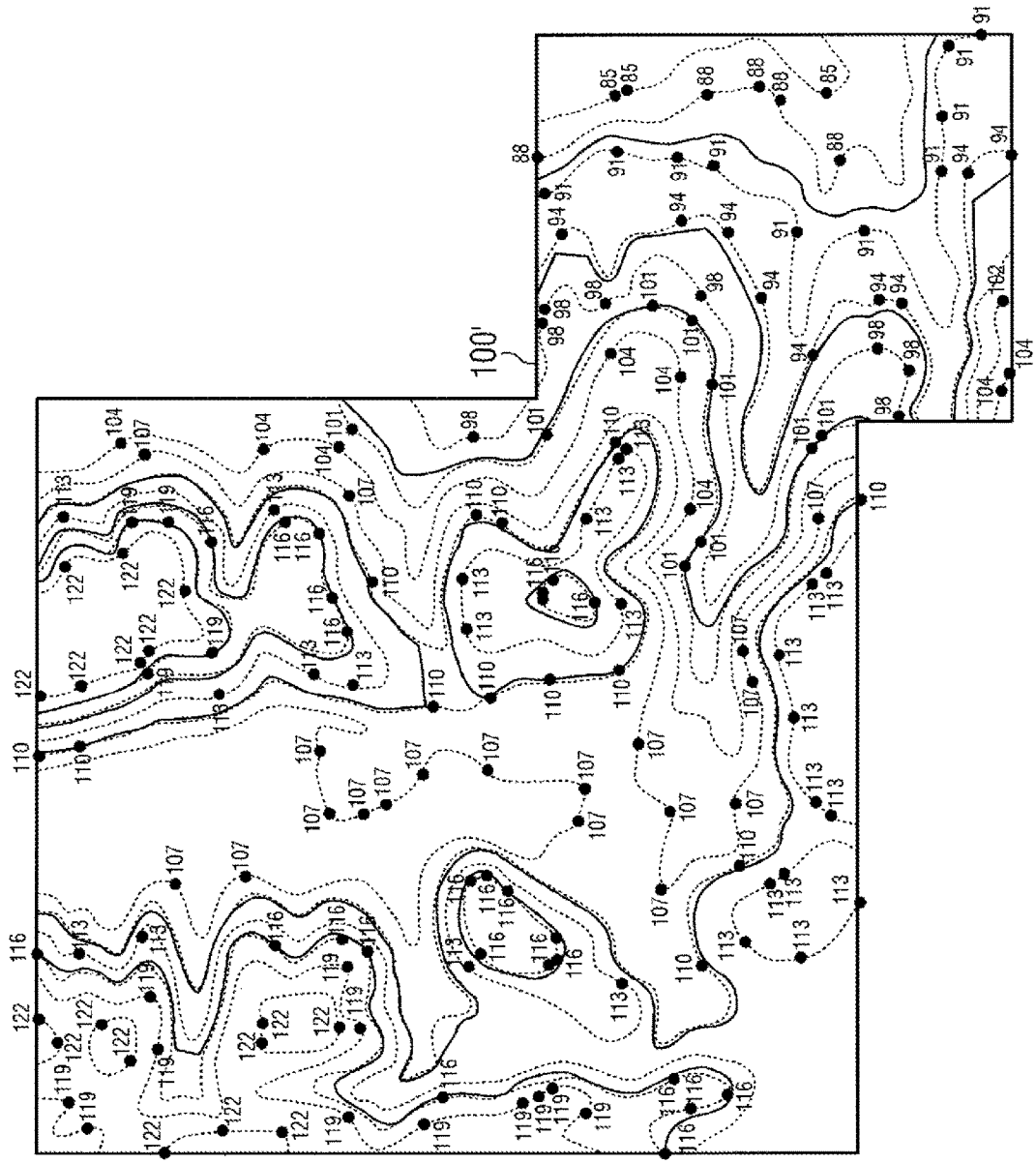
FIG. 2 shows a topology map of a system area 100' composed of two rectangles. The map shows individual peaks and also identical height planes by means of different gray shading. The system is to be constructed in this system area 100'.

The topology map in FIG. 2 has two rectangles, that is to say a large left-hand rectangle and a small right-hand rectangle, which are interconnected at the lower right-hand edge of the left rectangle. Contour lines and specifically illustrated points with specific height data are provided. It can be inferred from identical gray shading that an identical height is provided, for example the plateau in the top right-hand corner of the large rectangle, this plateau being arranged at 122 m. A low plateau at 107 m is arranged centrally in the left rectangle, denoted. The area to be occupied or developed by the solar system is denoted by 100' (the external outline of both rectangles together.

Such a map geometry with the height data, but with much finer resolution, is stored in the topology memory 13 of FIG. 1, for example as a discrete point area (within the system area 100'). If a coordinate is input at the input, the height value is output at the output 14b of the memory 13. In accordance with an alternative embodiment, an entire group of height values are output. Here, the topology with all points within a rectangle is output at the output 14b, wherein the rectangle may be predefined and the size thereof may be a little greater than the system block $S_1$ described further below.

FIG. 2.1 shows the application of the placement of system blocks, as will be explained in greater detail hereinafter, here preliminarily for adaptation to the topology, which will only be repeated conceptually in the following drawings, but is provided with reference to FIG. 2.1.

The bordered system area 100' is occupied starting from a first placement point 15. This placement point 15 on the topology map, stored in the memory 13, makes it possible for the memory to transmit an entire area, which for example may be larger than the system block S1, with topology data to the system block placer 12 via the input 13a. The system block S1 is then placed here in accordance with the following description, more specifically in a manner dependent on the topology prevailing to the right of and below the first placement point 15 in the system area 100'. Further system blocks S1 are then placed downward without "colliding" with the system blocks $S_1$ already placed previously, in the sense that they do not form an overlap, but a distance from one another can also be maintained in the shown manner. Conversely, the system can also be structured from south to north. Here, the first placement point would be 15d (in the bottom left-hand corner), and the system blocks will be placed a number of times in a continued manner from south to north (direction S-N and in columns from south to north). The starting point 15*d* is favorably arranged in a lower corner of the entire area 100.

24 system blocks are visibly placed in the system area 100', organized in individual columns, but not necessarily organized in continuous straight rows. It can be seen that the system blocks, although by a system block that is always the same, system blocks is placed.

A distinction is therefore made between a system block and a "placed system block", which is adapted. The system blocks are shown schematically in FIG. 3, in greater detail in FIG. 4, and a further system block is shown schematically in FIG. 10, and another system block is shown schematically in FIG. 13.

The system block in FIG. 3 is schematically illustrated roughly. It is sufficient for the system and the placer 12 to remember the structure of the system block and to place it a number of times, that is to say to place the block of FIG. 3 a number of times on the topology map, as illustrated in FIG. 2.1.

The system block of the aforementioned figures is produced here by a system block generator 11, in cooperation with a planner, user or designer. It defines a (first) system block, which it wishes to use in the system area. In cooperation with the on-screen presentation 18*a* on the display screen 18, the first system block 51 is generated and may have the appearance as illustrated in FIG. 3, or may have the appearance as illustrated in FIG. 4.

The generated system block has a fixed number of solar panels. Each solar panel is constructed as illustrated in FIGS. 1.1 and 1.2 with the solar surface 20 and the individual solar modules 21, 21*a* (first column), 22, 22*a* (second column), etc. forming said solar surface, wherein the individual solar modules form rows, denoted by 29, 29*a*, . . . . A respective column is denoted by 21', 22' and 23'. The solar surface 20 that is formed stands on feet or another type of frame, which may result in an inclination of the solar surface 20. Such a solar surface of a panel is accordingly a rectangular bar in the system block $S_1$ of FIG. 3. This panel $T_1$ and panel $T_2$ in the first row (to the left of the access Z) and the solar panels $T_3$ and $T_4$ in the same row (to the right of the access Z) form the first row.

The second row is formed by the solar panels $T_5$, $T_6$, $T_7$ and $T_8$. A distance a is provided between these two rows.

This distance a is also the same to the third row from the bottom. Although the optical impression of the system block $S_1$ of FIG. 3 may lead the viewer to believe that the distances a in the system block are different, this is not the case.

Four columns of solar panels are thus formed, wherein two columns are arranged to the left and also to the right of an access Z, which reaches from the edge of the system block at least to the DC-AC converter W, which has been generated substantially in the middle of the system block S1 at the location of a panel (or instead of a panel).

All solar panels of this system block are electrically assigned, that is to say electrically connected, to this inverter as an example of a DC-AC converter. This is achieved in an interconnection via array junction boxes (AJBs) and via generator junction boxes (GJBs) as far as the inverter. From the inverter itself, a line is then laid to the transformer station 90, which will be presented later, however these electrical lines have not yet all been predefined and do not have to be part of the system block 51. This concerns the placement of the solar panels in the area shown in FIG. 8*ff* as a system area 100.

The system block S1, as will be applied later or as has already been applied clearly to form a basis of understanding in FIG. 2.1, can be changed in accordance with FIGS. 3.1 and 3.2.

Both versions undergo an adaptation, which is possible before the system block is placed with a topology adaptation in the area 100.

A shearing by the angle (approximately 30° to the right) causes the access Z to run in an inclined manner and causes all panels to remain in the same row, just running in a staggered manner along the inclined left delimitation of the system block, however the row orientation is maintained. The distance a also remains the same with this shearing. The reference signs remain the same, only the inclination has been added, and the sheared system block $S_1$ is denoted by $S_1'$.

A second change to the system block $S_1$ leads to the system block $S_1''$. This is illustrated in FIG. 3.2. The system block $S_1$ is mirrored about a vertical central plane, such that the converter is arranged to the left and the left-hand panel $T_1$ is arranged fully to the right. A mirroring which is not illustrated is a mirroring about the central plane running perpendicularly thereto. Both mirrorings can be applied individually or also in a combined manner. If they are combined, this corresponds to a rotation of the system block about its central point.

A more detailed illustration of a second system block, as is provided with the solar modules on the panels, is illustrated in FIG. 4. Here, eleven rows are provided beneath the converter W and twelve rows are provided above the converter W. A column of panels is provided to the left and right, however these are divided into four columns when considered in greater detail, because each panel row in the left-hand column is formed from two panels arranged close to each other. The column visible in FIG. 3 between two panels within a row to the left of the access Z is so small that it is imperceptible in FIG. 4.

The access Z is arranged here horizontally to the right, but likewise from the edge of the system block to the DC-AC converter W.

Just one converter W is provided per system block S1, such that the system block $S_1$ can also be considered as an "inverter area", that is to say comprises all the solar panels of which the electrical connection leads to this inverter W of the system block. The spacings between the panel rows are denoted by "a" in the system block $S_1$ of FIG. 4. All spacings a are the same, with exception of the spacing that produces the access leading to the inverter.

Figure 5:
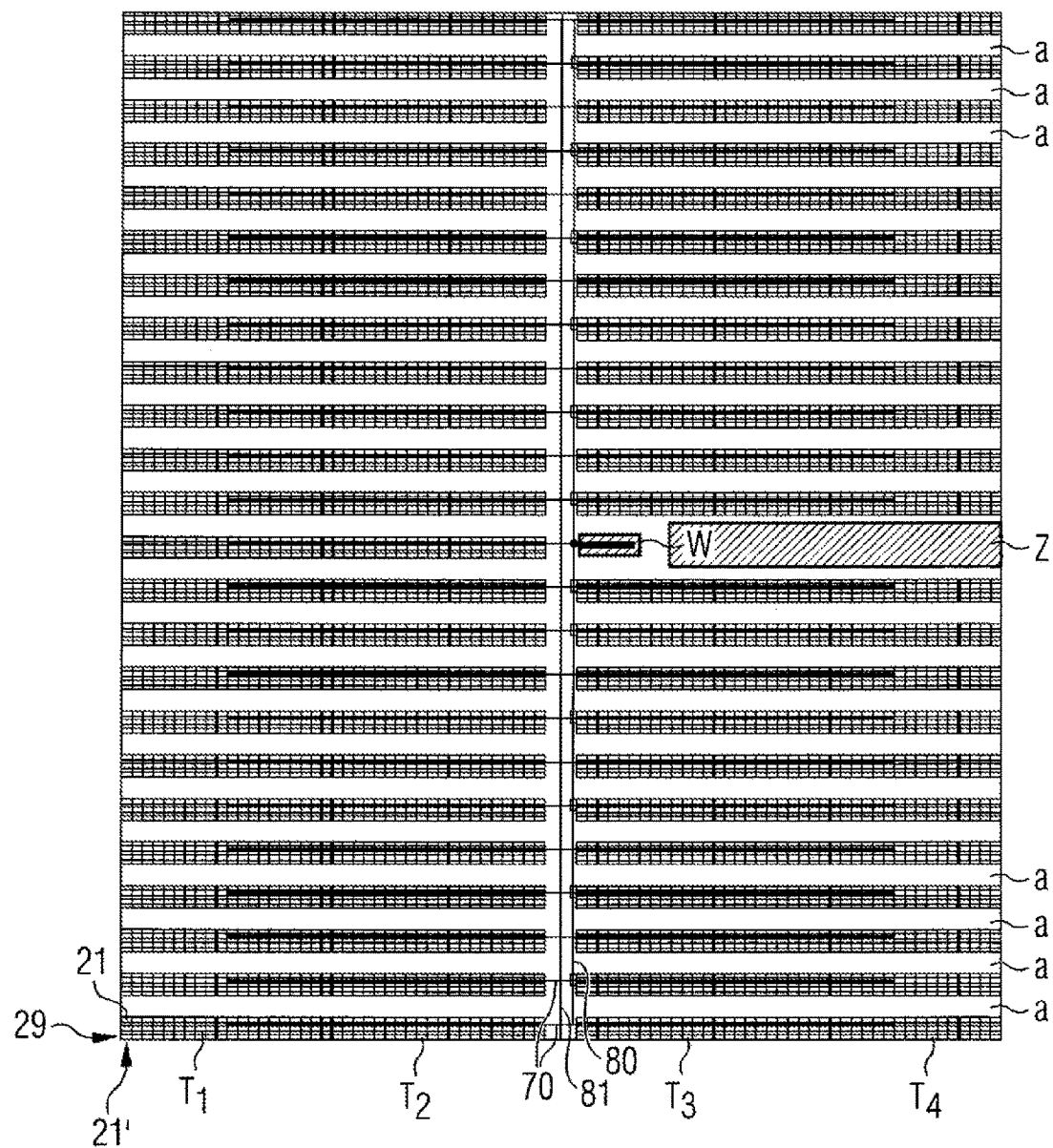
FIG. 5 shows an enlarged system block corresponding to that in FIG. 4, just with greater resolution.

The cabling, which does not necessarily belong to the system block S1, is illustrated in FIG. 5 (as an enlargement of FIG. 4), because it cannot be illustrated (is too small) in the subsequent illustrations where the system blocks are placed in the system area. The cabling includes the connection of the AJBs of all panels, wherein a row of panels is combined in each case and a horizontal connection 70 is produced (per panel row). The vertical cabling 80 is produced via AJB connectors, and leads to the inverter W. The inverter W itself is connected via the connection line 81, which is also laid vertically, to a transformer station 90 (not illustrated here).

The spacing of the first row to the second row and of the second row to the third row is a in each case. The spacing between the other panel rows is also a in each case in the column direction, apart from where the access Z to the inverter is laid from the edge of the system block $S_1$.

Such a system block, as has been defined in FIG. 3 or FIG. 4 (enlarged in FIG. 5) by the system block generator 11, is fed to the system block placer 12. In the placer 12, the system block is either accepted in unchanged form for the placement, or is changed in accordance with FIG. 3.1 or 3.2 (or one of the other mirrorings also specified there). However, this change does not change the number of solar panels and arrangement thereof with a fixed spacing of rows and columns, does not change the only one converter provided, and also does not change the presence of the access from the edge at least to this converter.

Figure 6:
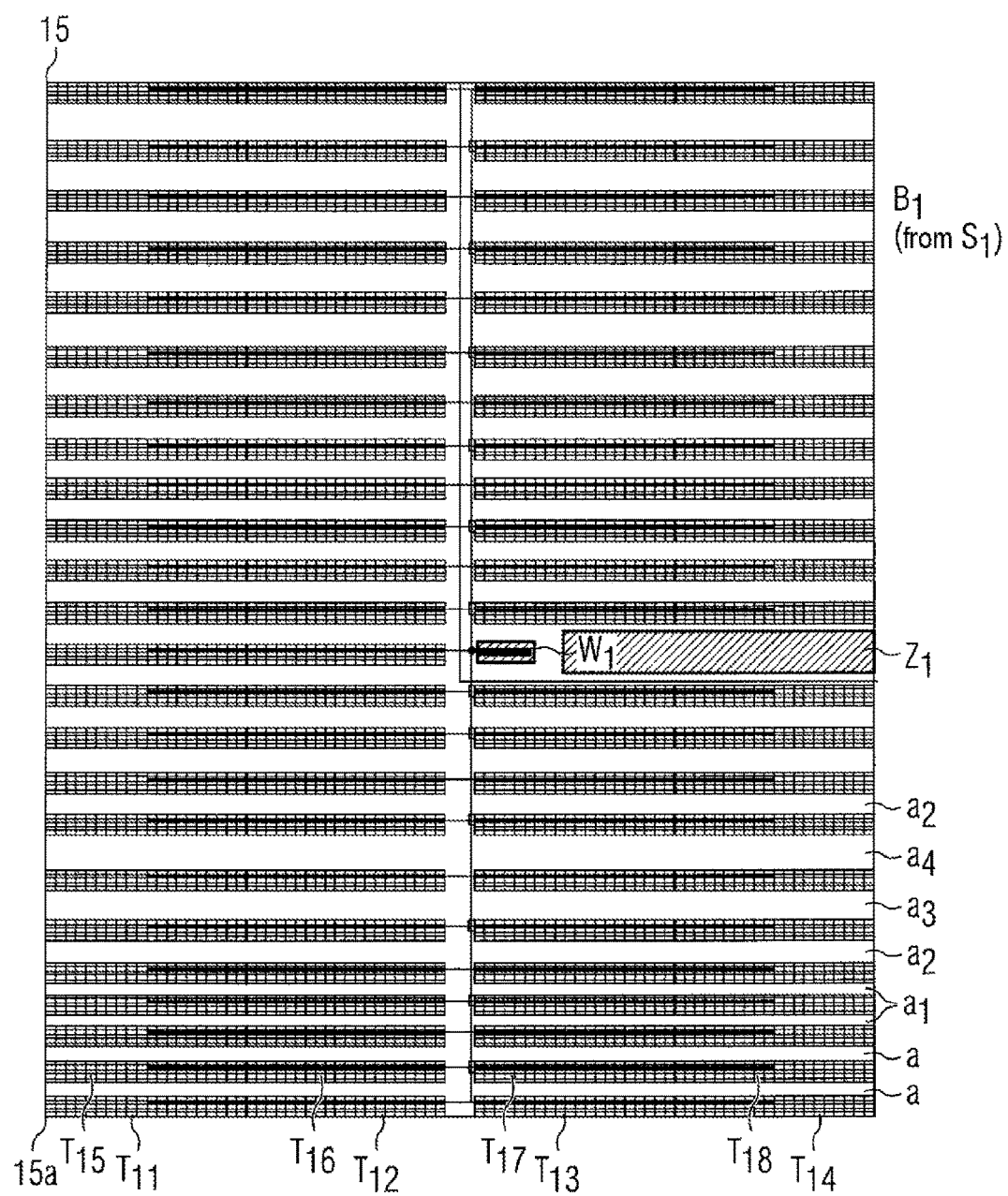
FIG. 6 shows a placed system block corresponding to that in FIG. 5, just with a change of the spacing of the individual panel rows from one another (spacing changes viewed in the column direction). Two columns can be seen, within which the spacings a between the rows change (in equal measure).

In the assumed example of FIG. 6, the system block of FIG. 4 is used. This system block $S_1$ is not mirrored and is not sheared, but is placed merely in a form dependent on the topology of FIG. 2. To this end, the system block placer 12 receives the topology data via the output 13a from the functional element 13 and identifies the start of the operation as the first placement point 15, this being the upper left-hand corner in the example of FIG. 1, as it was also in the symbolically illustrated case of FIG. 2.1.

The system block from FIG. 4 is then changed in terms of the spacings a between the solar panel rows in accordance with the topology, and this change is dependent on the topology, that is to say the course of the ground at the location where the generated system block $S_1$ is placed as block $B_1$ (placed system block). The placed system block $B_1$ has a different extension in the longitudinal direction. Its width remains the same, however an adaptation in the longitudinal direction is produced as a result of the change to the spacings and may be either an enlargement or a reduction compared with the model or the template of FIG. 4.

It can be seen with reference to FIG. 6 that the influence of the topology data via 13a at the placer causes the system block to be expanded or compressed in the longitudinal direction, however this is performed per row.

The orientation can be started in the top left-hand corner when the first system point 15 lies at the top to the left. However, another placement can also be performed with the first system point 15a, which is arranged in the bottom left-hand corner. This is to be used for the example of FIG. 6. The first two spacings between the first three rows are unchanged with a because the area is flat here. In the subsequent rows, shorter distances are produced, which the functional element 12 calculates in accordance with the topology at this location, and performs an adaptation of the spacings to a1, wherein a1 is smaller than a. There is thus a slope in this area, as viewed in the Northern Hemisphere, such that the panels can be arranged more closely to each other when they are inclined and oriented southward toward the equator. A steep area of the topology can then be identified, because the spacing between the panels is greater, the spacings $a_2$ and $a_3$ become increasingly greater, such that the gradient is increasingly steeper. Only with the spacings thereafter, that is to say after the eighth panel row, does the spacing become smaller again and corresponds for example to the spacing $a_2$, wherein the gradient is less steep.

These spacings are calculated with the aid of the shadow angle, which remains the same for entire system and was explained with FIG. 1.2. There, it has the value σ (sigma).

A placed panel is a system block that has been adapted in a manner dependent on topology in accordance with FIG. 6. The converter is no longer abstractly W, but $W_1$ for the first-placed panel. The access Z is no longer abstract, and instead the first-placed access $Z_1$ and the panels receive another index dependent on the placed system block, in other words $T_{15}$ (first block, fifth panel), $T_{16}$, $T_{17}$, $T_{18}$. In the example of FIG. 6, the block $T_{11}$ (first panel, first block) starts at the first placement point 15a in the lower left-hand corner.

If a number of these system blocks are placed successively, the auto-placer 12 may thus place the next system block as explained with reference to FIG. 7. Here, the transformer station 90 can be seen, and the second placement point 15b is defined automatically by the auto-placer 12 and is arranged below the point 15a and slightly distanced therefrom so as to be able to still lay a subsequent track therebetween, which can be used as a road or as a cable path to the transformer station.

The second-placed block 51 is the same system block from FIG. 4, just is adapted differently, because the topology starting with the second placement point 15b is different from that of the surface extension of the first system block. The first system block $B_1$ (after its placement) receives a second system block $S_1$ placed relative thereto, which does not overlap it and which does not exceed the system border 100. The second-placed system block $S_1$ is denoted $B_2$.

The system block $S_1$ from FIG. 4 has also been used for the placement of $B_2$, without shearing or mirroring. The access Z is arranged to the right of the converter.

In the system block $B_2$, the placed converter W becomes $W_2$ and the placed access Z becomes $Z_2$.

Later, not now, but contained in FIG. 7 for illustrative purposes, tracks are added that can be used as navigable paths or as cable paths in the constructed solar system. They are oriented such that they are laid between the placed solar panels, but not within or through a placed system block, but only between placed system blocks $B_1$, $B_2$, . . . .

Figure 7:
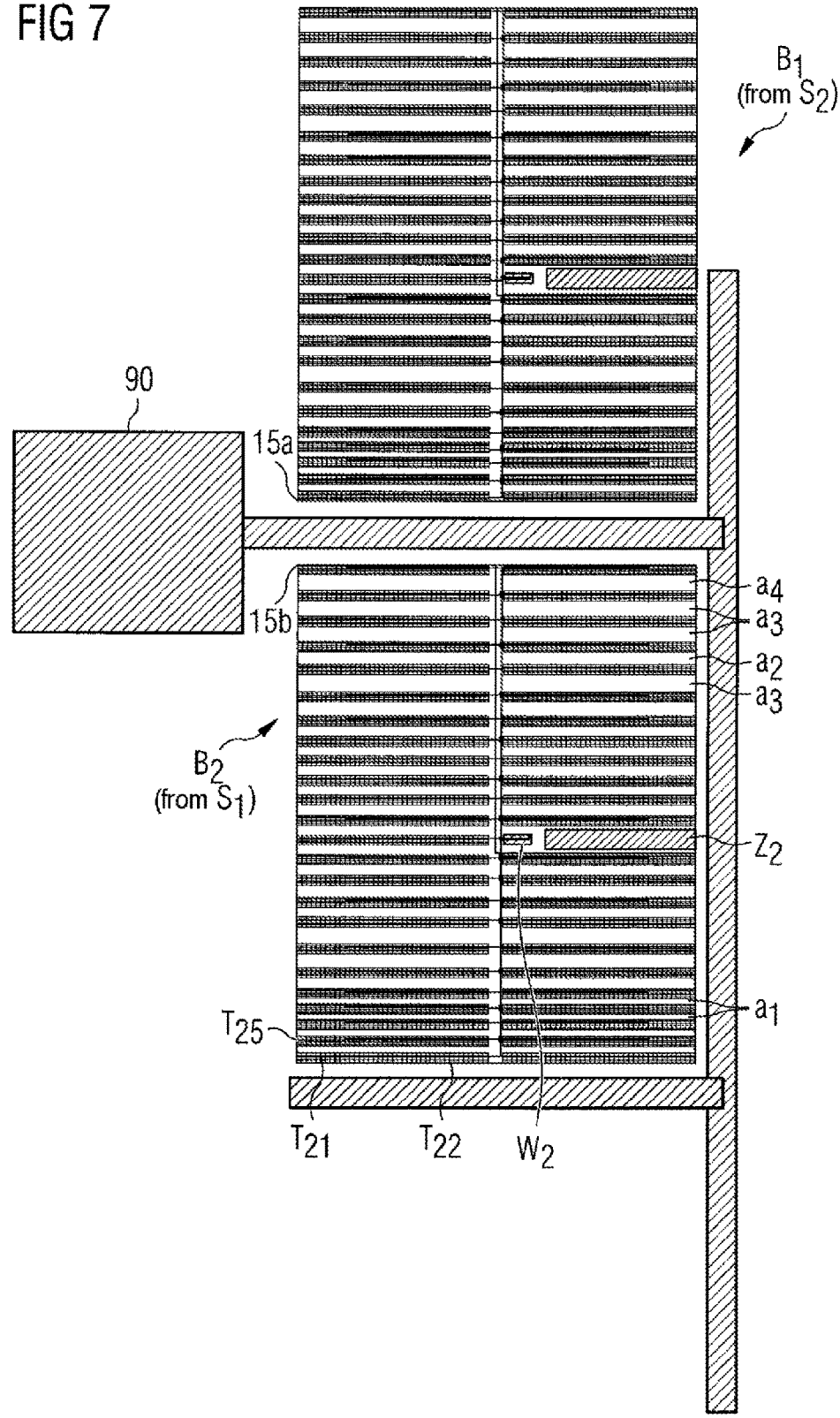
FIG. 7 shows the layout concept of the system block placer, as it places two system blocks, and as tracks can be added subsequently, once the placement for the system area is complete, over which tracks cable paths may run or over which a vehicle may travel.
Figure 8:
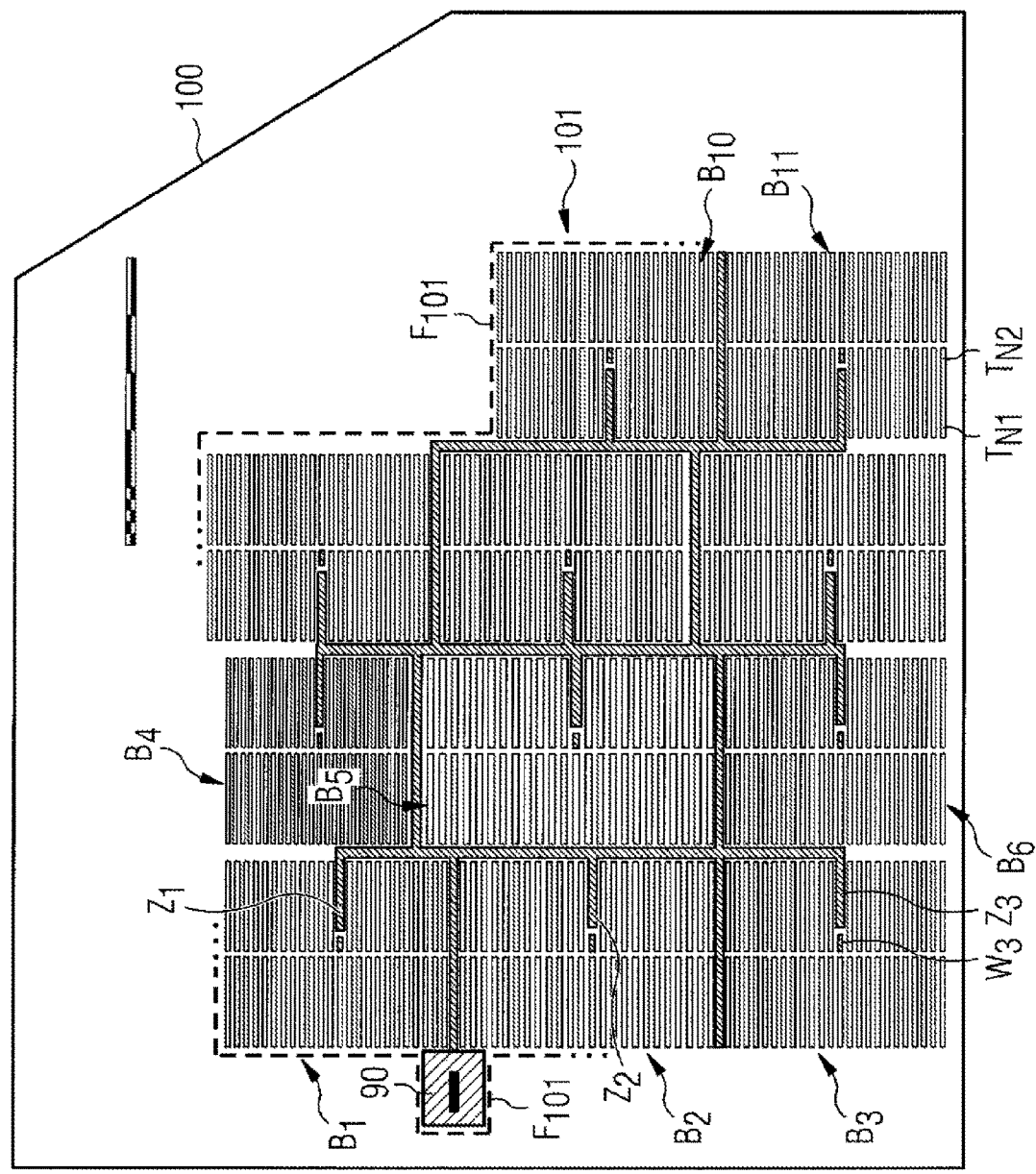
FIG. 8 shows a wide placement of the system block $S_1$, wherein the extension runs more in the width than in the height of the system area 100.

The result of the continuation of the following multiple and ongoing placement, which has been explained twice with reference to FIG. 7, can be seen in FIG. 8. The placed system block $B_1$, the placed system block $B_2$ and additionally to FIG. 7 the system block $B_3$ placed therebelow can also be seen. The system block $S_1$ from FIG. 4 was used for all three placed system blocks, and there was no mirroring or shearing. It is possible to understand how FIG. 7 is supplemented by the next-placed system block $B_3$ in a manner oriented to the transformer station 9. The placed converter $W_3$ and the placed access $Z_3$ are produced.

Figure 9:
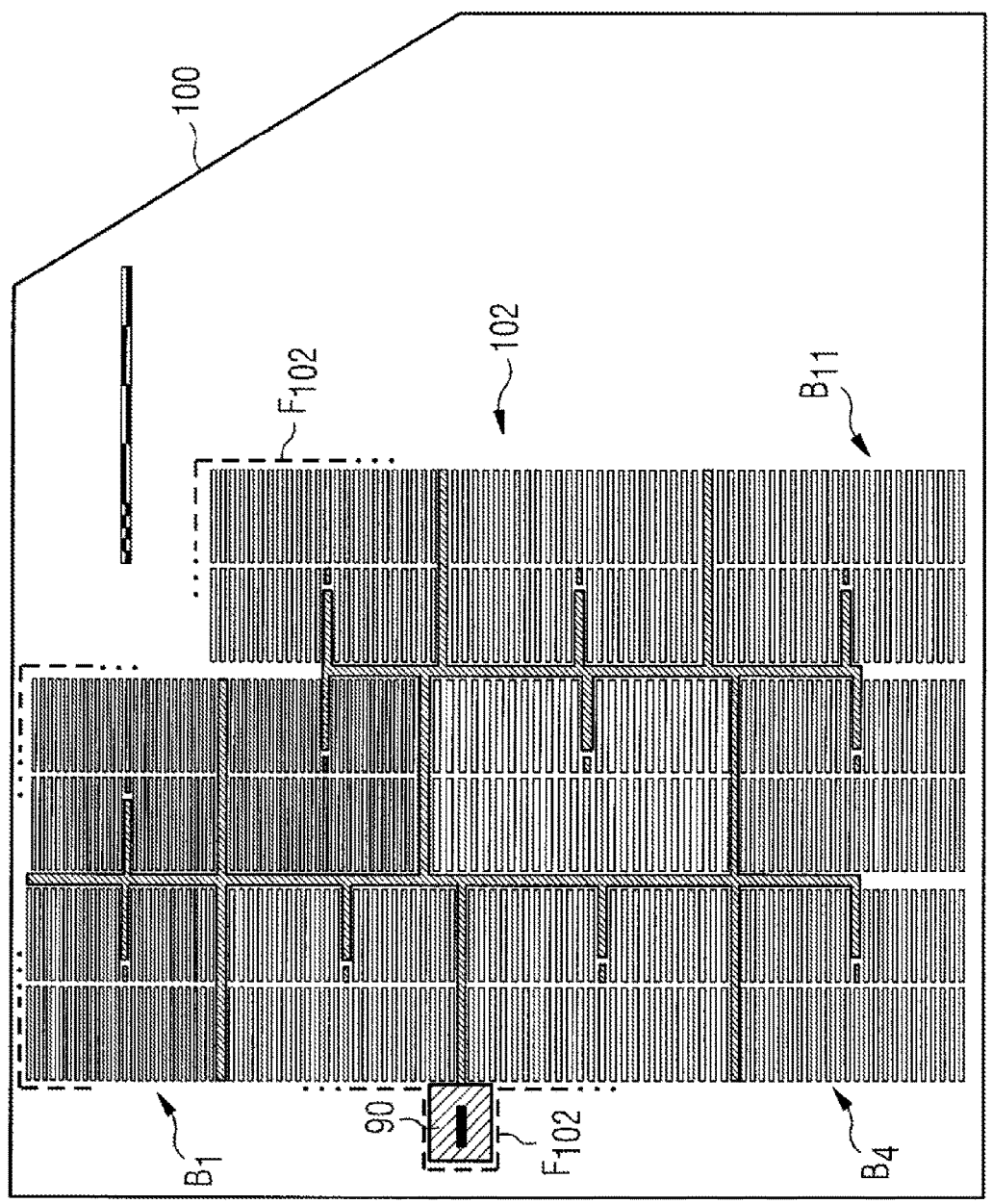
FIG. 9 shows the same system block $S_1$, just taller than wide, in the sense of another placement of the same system block. The system area 100 is the same.
Figure 11:
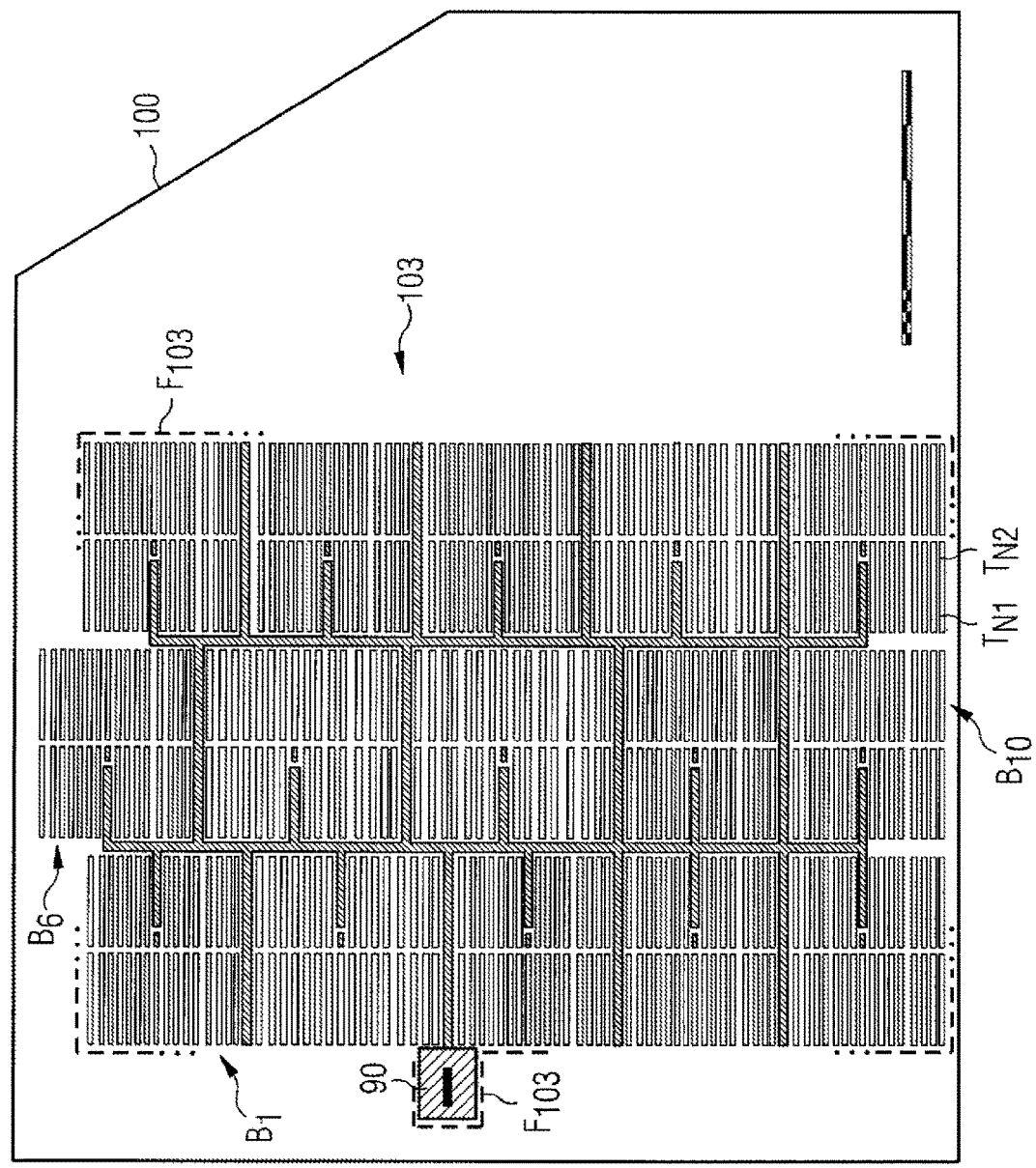
FIG. 11 shows the placement of the system block $S_2$ from FIG. 10 in a structure of the system that is taller than wide.
Figure 12:
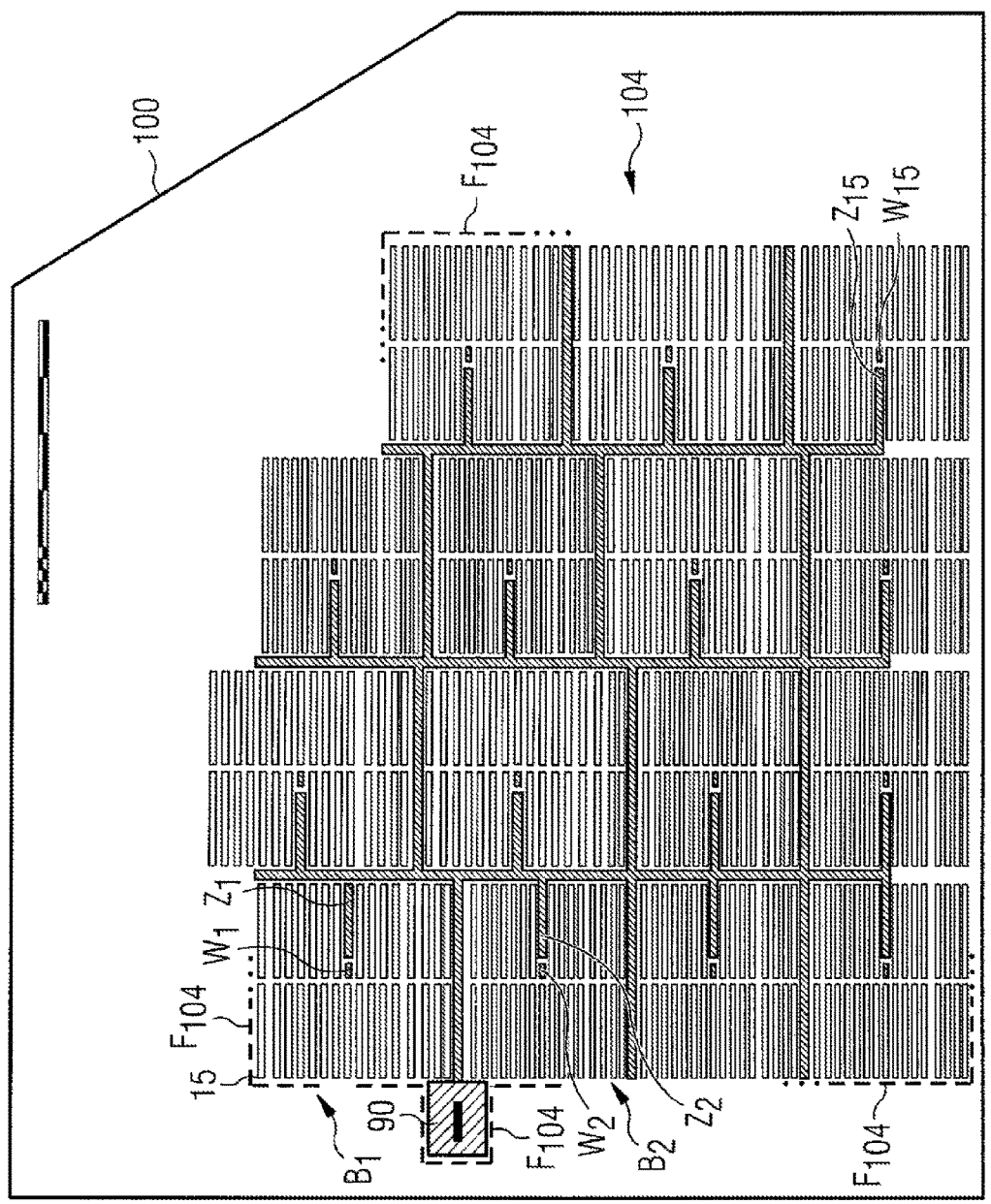
FIG. 12 shows an application of the system block $S_2$ in a system that is approximately square, but is wider than FIG. 11 in the aspect ratio.

FIG. 8 in particular illustrates the system area 100 receiving the photovoltaic system 101 to be constructed. Within the area however, which is framed by the line 100 (as delimitation), the constructed photovoltaic system 101 requires only a smaller area, denoted by $F_{101}$. Different systems may thus have a different extension, in the vertical direction or transverse direction, can occupy the available total area 100 to a greater or lesser extent, and a multiplicity of systems thus formed, which are explained with reference to the following FIGS. 9, 11 and 12, are stored in the memory module 10 for comparison purposes for a subsequent multi-objective optimization and associated presentation by the computer core 16.

It will be explained on the basis of the example of FIG. 8 that the nominal power of the constructed PV power station 101 with PN=27.8 MW and the block power of a system block $S_1$ with 2.5 MW are to be estimated. With the eleven placed blocks in the area F101, a total power of 27.5 MW is produced and is supplemented by an additional smaller block, which can be placed manually, to give the total system power. This type of supplementation is a post-structuring of the system 101 already almost completely structured, which supplements this system state achieved by the system block auto-placer 12.

To this end, a partly first system block can be used, which is tailored such that the total power of the system is attained. This also corresponds to one of the termination criteria identified by the placer 12. If it were to place a further system block $S_1$ beside the eleven blocks $B_1$ to $B_{11}$ already placed, a possible location would be to the right of block $B_{10}$ (at the right-hand edge of the area $F_{101}$), and therefore the nominal power, which is predefined, would be exceeded. The placer 12 thus terminates the automatic placement before the entire area 100 is filled with system blocks $S_1$. A further placement of the system block $S_1$ would exceed the predefined nominal power of 27.8 MW.

Another possibility, not shown in this image of FIG. 8, for terminating the continued placement is then provided when the system area 100 is already filled, but the system nominal power has not yet been reached. A further system block $S_1$ then could not also fit between blocks already placed and the edge 100 of the system area without overlapping the blocks already placed.

The change to the spacings, which is achieved by an amended length (in terms of height in the image) of the system blocks can also be seen in FIG. 8. The block $B_1$ and the block arranged next to it to the right in the second column are clearly of different length, which is the result of shorter row spacings a in the right-hand block $B_4$. The block $B_5$ arranged below has much larger spacings between the rows of the solar panels, such that the length of this block is much greater than that of block $B_1$ The tracks already shown (highlighted in gray) are inserted subsequently. They show how the finished structured system 101 can be completed. Here, all accesses in the system blocks are connected to an external track. The first six blocks $B_1$ to $B_6$ are placed in the original orientation as blocks such as those illustrated in FIG. 3. A mirrored version in the sense of FIG. 3.2, applied to the system block $S_1$ of FIG. 4, leads to the placement of the three system blocks in the third column. These blocks have their access Z oriented to the left so as to lead to a laid path that, from its left-hand side, receives or connects the other accesses of the middle three blocks $B_4$, $B_5$ and $B_6$.

The transformer station 90, which is connected via an extra track, can also be seen to the left in the image. Vehicles can travel over these tracks, people can walk on these tracks or merely cables/lines can be laid on these tracks. This is dependent on the user and the case of application.

The DC line of all placed eleven inverters $W_1$ to $W_{11}$ are combined at the transformer station 90 and are connected via corresponding cables (not shown here however) to the transformer station. Accordingly, the transformer station 90 has twelve inputs for the eleven inverters and the smaller system block yet to be placed so as to achieve the system nominal power in an accurate manner.

FIG. 9 illustrates another placement. FIG. 9 functions with the same system block $S_1$, which has also been used to structure the system 101, and the system area 100 is also the same.

However, a different area $F_{102}$ is occupied within the system area 100 and is likewise produced by eleven placed system blocks as blocks $B_1, B_2, \ldots$ to $B_{11}$.

The different result is obtained here by a different starting point. The system block $5_1$ is placed for the first time as block B1 further towards the top in the system area 100. Here, the placed system block B1 has a much shorter length due to the different topology present in this area, and the spacings between the rows are reduced, which causes an incline (in the Northern Hemisphere with inclined solar surfaces 20 in the direction of the equator). This can be seen in comparison to the placed block $B_1$ of FIG. 8. The following placements are made in accordance with the previously described steps by means of the placer, which is fed from the topology memory 13 and automatically selects the next location that is to be "developed" as a further area part following a completed placement. Four placed blocks are therefore created in the first column, four placed blocks are also created in the second column, and three blocks are created in the third-placed column, which also together define eleven blocks, which are to be structured subsequently by a supplementation block in order to reach the system nominal power.

Here too, it is particularly clear that the system area 100 is not fully utilized, and therefore a person skilled in the art can envision a large number of other placements that can be implemented, even with constant position of the transformer station 90, if at least one block is placed differently, which is the same system block $S_1$ generated by the structure of the system according to FIG. 8.

The structured system 102 and the structured system 101 are two cases of superstructures of a PV system that are stored in the memory arrangement 10.

Figure 10:
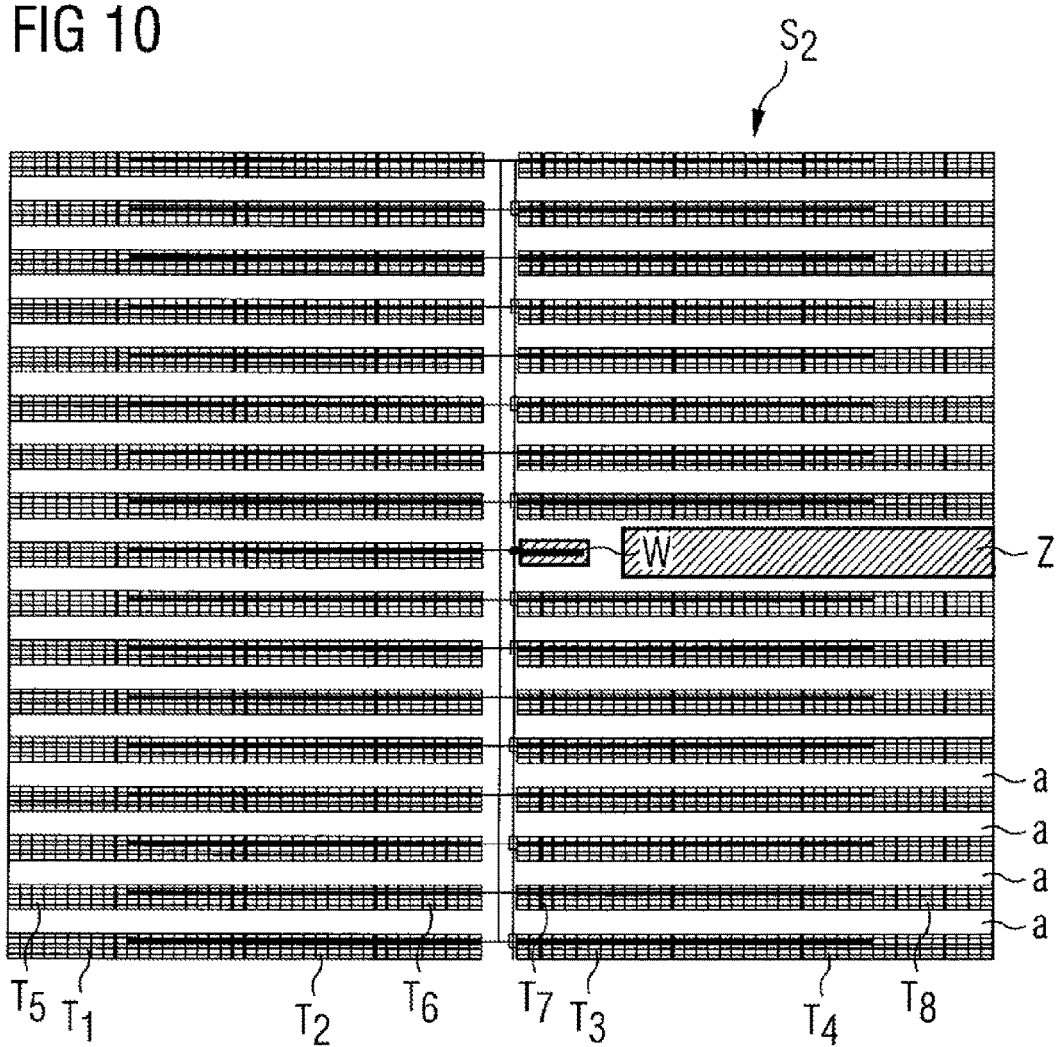
FIG. 10 shows a second system block $S_2$, which is to be viewed in comparison with the first system block $S_1$ from FIG. 5. It is shorter and wider. It has fewer panel rows, but also two columns of panel rows (to the left and right of the vertical central plane). The electrical wiring by the cables also illustrated is not part of the block, but is provided only symbolically.

In the next image of FIG. 10, it can be seen that a system block of different configuration is used. This further system block may be a second system block compared with the first system block illustrated in an enlarged manner in FIG. 5 and symbolically in FIG. 4.

The system block $S_2$ of FIG. 10 is shorter (less tall in the image) and wider than the system block $S_1$. Its construction is similar, however it has fewer rows of solar panels. Eight solar panel rows are arranged below the access Z, and eight solar panel rows are also arranged above the access. A further solar panel row is arranged in the extension of the access in the left-hand half of the image. Although not directly visible, two columns of panel rows are provided to the left and to the right of the vertical central plane and are separated (centrally) by a spacing that is not perceptible in the drawing. The greater spacing is located in the central plane, and two columns of panel rows are also provided to the right.

The panels are thus arranged similarly to those in the system block of FIG. 5. The spacings a are also provided and are equal between all panel rows in the column direction.

The wiring via the cables/lines also shown is provided merely symbolically and is not necessarily part of the system block $S_2$. The system block $S_2$ likewise has a fixed number of solar panels, here fewer, and an arrangement in a fixed number of rows and columns. The number of columns corresponds to that of FIG. 5, whereas the number of rows is smaller than that in the system block of FIG. 5.

Only one DC-AC converter W is provided, and there is one access, which leads from the edge of the second system block $S_2$ to the converter.

A first placement of the second system block of FIG. 10 is explained with reference to the following FIG. 11. Here, the intermediate step via a figure corresponding to FIG. 7 explained before in greater detail is omitted, and the entire PV system 103 likewise to be placed within the same area 100 is shown in FIG. 11.

The transformer station 90 is arranged in the same location and a number of fifteen system blocks is given following completion via the auto-placer 12, these system blocks almost reaching the nominal power station power of 27.8 MW, but not exceeding it. The nominal power of a block is lower due to the lower number of rows, and therefore more blocks are placed in order to reach the nominal power. In the shown example, a block has the nominal power of 1.85 MW, such that the nominal power is achieved completely. There is no need here for any post-structuring. The area 100 is not completely occupied, even with use of this system block $S_2$, but the area $F_{103}$ is smaller than the area that would be allowed by the edge line or the delimitation 100 of the system area. Here too, the criterion for termination of the automatic placement is the arrival at the nominal power of the power station 103 to be constructed.

A further power station 103, which is structured and of which the layout is stored in the memory 10, is created with FIG. 11.

A definition of the first two columns show that the first column is constructed only from original system blocks S2 without shearing and without mirroring, and all access Z run to the right. The second column, starting with $B_6$ is created from mirrored system blocks $S_2$, which have been mirrored about the vertical central plane by the functional element 12 and have then been placed as blocks $B_6$ to $B_{10}$ in a topology-dependent manner.

A continuous spacing is produced for a subsequently laid track, which makes it possible to connect all first ten blocks (to a vertical track) and to which all accesses of the ten placed blocks run.

All fifteen placed inverters as converters of direct current (DC) to alternating current (AC) are connected via an accordingly equipped line capable of carrying current to the transformer station 90, which (not illustrated here) is electrically conductively coupled to the synchronous grid installed outside the system 100. The same is also true for the transformer station 90 in FIGS. 8 and 9.

In FIG. 12, a fourth power station 104 is constructed in the same area 100 with a different placement of the system block $S_2$ from FIG. 10.

It can be seen in FIG. 12 that the placed second system blocks S2 are placed with a "modulated" row spacing a as blocks $B_1$ to $B_{15}$. Compared with FIG. 11, the same system block $S_2$ is used, only the first placement starts with the starting point 15 closer to the transformer station 90, such that a different system 104 is produced, which can also be referred to as a differently structured system, but has the same power. The PV system 104 takes up an area $F_{104}$ that is smaller than the same delimitation 100 also used for the systems in FIGS. 8, 9 and 11.

The change to the row spacing a within a system block when this has been placed is also clearly visible. This modulation is controlled by topology.

The respective calculation of the row spacing ai to be placed is performed under consideration of the shadow angle by the system block placer arrangement 12, which is fed data concerning the topology from the topology memory 13. The other system block used for FIGS. 11 and 12 was generated by the system block generator 11 and for example can be presented on the separate screen 18 in the image portion 18a. The structure of the finished constructed system 104 is also stored in the memory arrangement 10.

Four different types of constructions of photovoltaic systems are thus described, that is to say those that operate with a first system block, those that operate with a different placement of the same system block, systems that operate with a different system block, and lastly also those that operate with a different placement of the different system block. The term "operate" is to be understood in the sense of system-constructing operation.

These multiple system constructions result, with a corresponding multiple of different system blocks, in a large range of possibilities for the system configuration. All configurations are stored in the memory 10.

Figure 13:
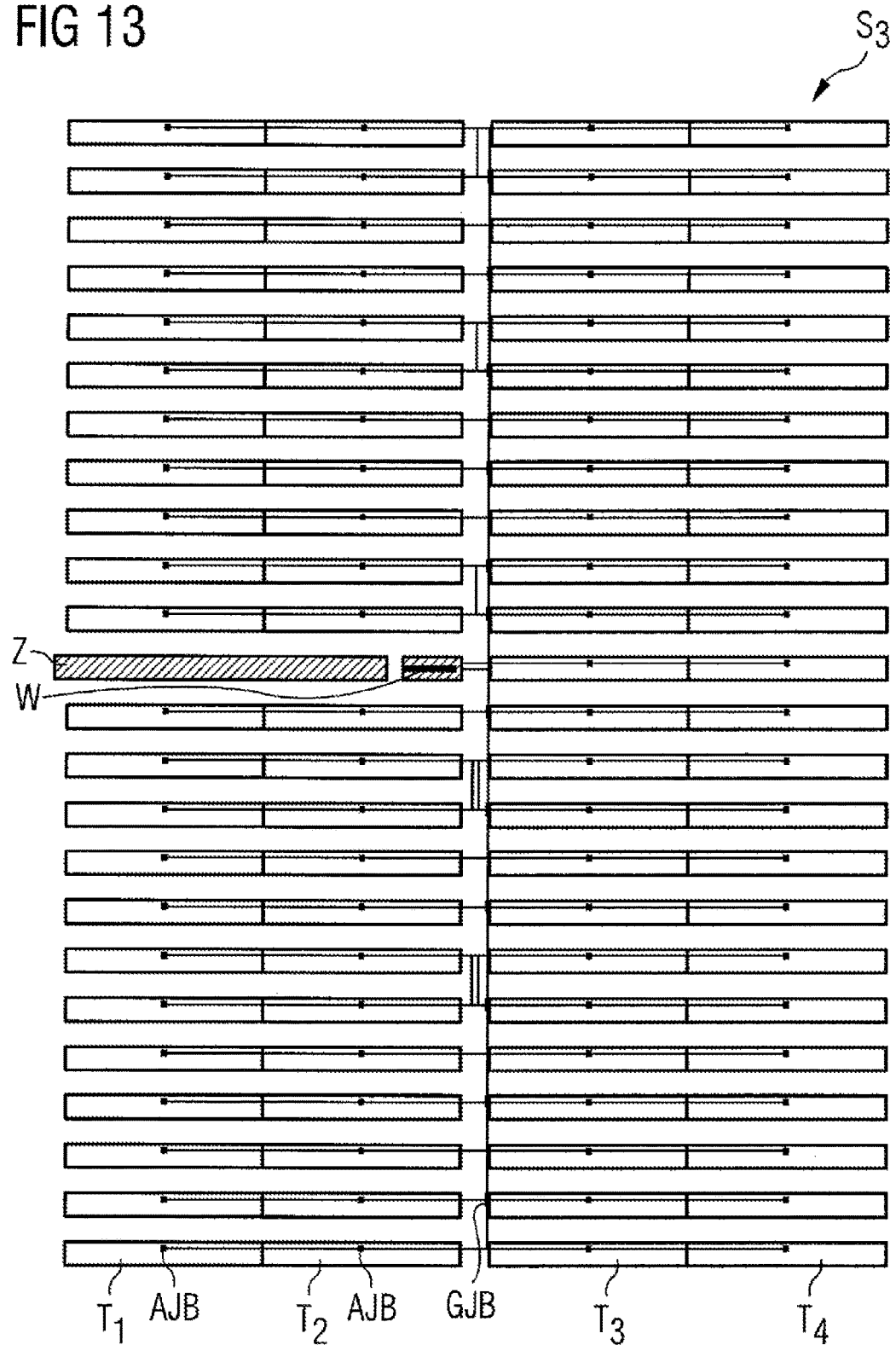
FIG. 13 shows another system block that is similar to that from FIG. 5, also has 24 rows of solar panels, but is slimmer, that is to say has shorter panels in the row direction. Here, the modules are omitted, such that the panels as such can be seen. Two columns of solar panels are shown to the left, which are arranged close to each other, leaving a vertical gap, and two columns of panels are shown to the right, which are also arranged close to each other.

A further system block configuration is clear in an abstract manner from FIG. 13. FIG. 13 shows the omission of the individual modules, such that only the solar panels are still shown, which consist to the left of a central column of two columns that are arranged close to each other, and which consist to the right of the central plane likewise of two columns, which are arranged close to each other. The entire system block thus consists of four columns, twelve lower rows and eleven upper rows, with reference to the substantially centrally placed DC-AC converter W and an access from the left-hand edge of the system block to this converter W.

Due to the omission of the solar modules, the electrical wiring can be seen in greater detail. A respective solar panel is electrically connected via its strings of solar modules to an AJB, and a plurality of these AJBs are electrically connected to a GJB, which leads to the inverter W. The interpretation can also be turned around, that is to say a number of GJBs (junction boxes) can be placed in the system area of this system block and each combine a group of power lines (coming from AJBs), such that an inverter W is fed by a number of GJB outputs. To this end, the inverter has a number of inputs in order to receive current from a number of GJBs.

Figure 14:
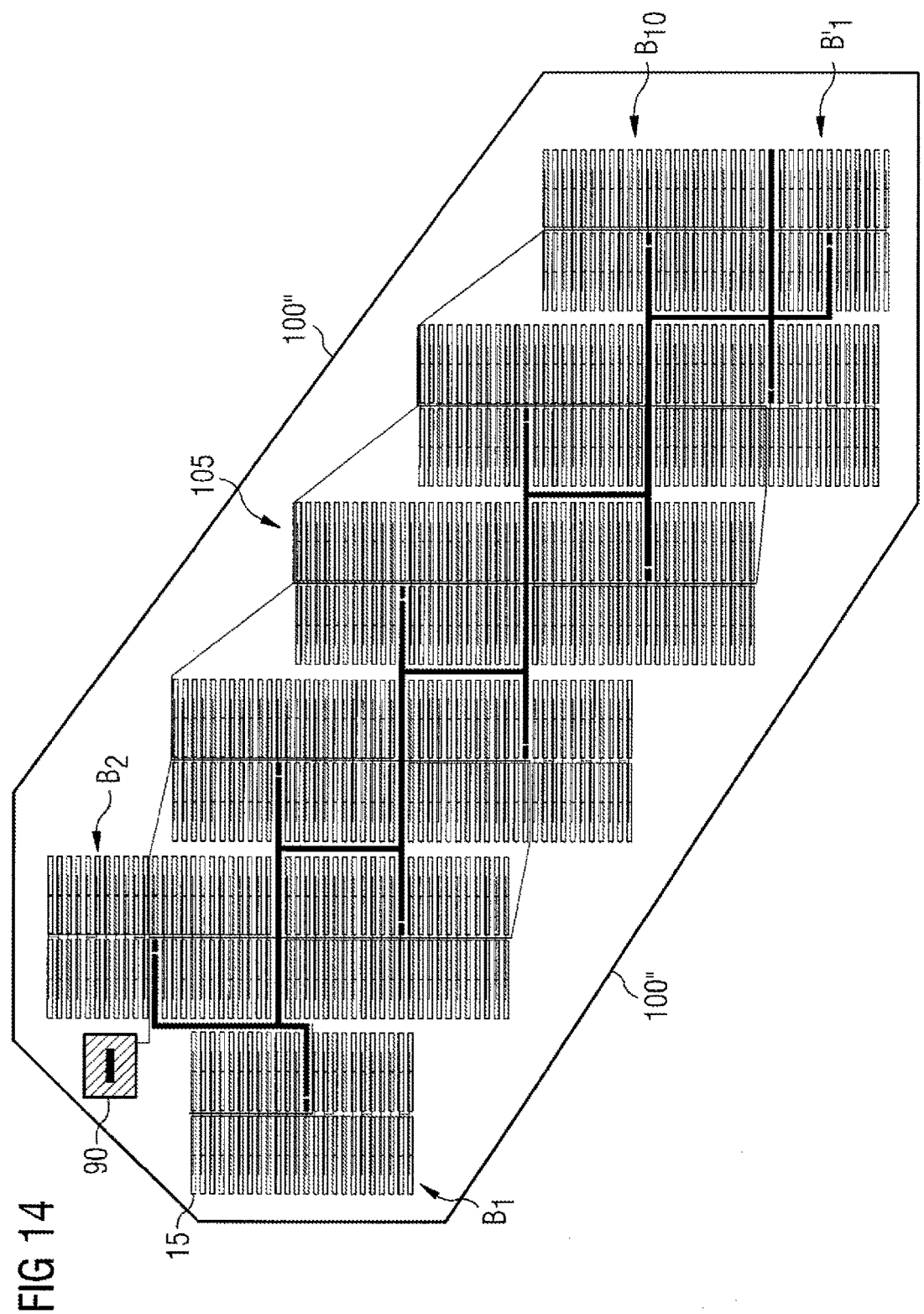
FIG. 14 shows an example of a layout of a photovoltaic system in another area 100''. This area is substantially flat and the system block according to FIG. 13 has been used in this flat area, wherein, even with the topology adaptation, there has been no change to the row spacings of the solar panels in the system block with the placement.

The third system block $S_3$ from FIG. 13 is slimmer than that from FIG. 5. It has more panel rows, but a shorter extension in the width direction. The placement of the system block $S_3$ will be explained in an alternative system area 100", which is shown in FIG. 14. Here, a transformer station 90 is also provided, however the area is not so closely approximated to a square as the area 100 from the previous figures. Rather, it is an inclined strip, which has complicated limits.

The automatic placement starts with the system block placer at the point 15. Here, this placer makes it possible to place just one system block as B1. A further system block cannot be placed beneath the block B1 because the limit would not allow this. The auto-placer thus starts the next column and the placement of the block $B_2$. It can place a further system block S3 below this block, this further system block being visible as $B_3$. Then, it has to change column again. The tracks already shown (darker gray), which connect the accesses of each system block, are already shown for the finished system 105, but were only added at the end, once the system block placer 12 had placed all ten system blocks $S_1$.

A post-structured partial system block called $B_1'$ can be seen in the bottom right-hand corner. This block is smaller and is a portion of the system block $S_3$, "trimmed" around its central point and the inverter W.

Following the placement of the tenth system block $B_{10}$ (bottom right-hand corner in FIG. 14), the auto-placer 12 identifies a termination criterion, that is to say the fact that the system power has been reached practically completely. If it had placed a further system block, the system power would have been exceeded. The second termination criterion taken into consideration by the auto-placer, however, is also met or would also have been met, that is to say the next placement of an entire system block $S_3$ would have exceeded the limits 100", and therefore this block cannot be placed, and instead the automatic placement by the functional element 12 is to be terminated.

The post-structuring with a smaller remainder block as a "different block", based on the same block $S_3$ changed for the entire system 105, terminates the structuring or "completes" the structuring, which was previously already terminated in an automated manner.

Due to the flat course of the topology of the system area 100″, which has practically no gradient, FIG. 14 shows a practically uniform distance a between all panel rows in the system blocks following placement thereof. The difference between the row spacings is so low that it is provided in the drawing, but is not optically perceptible. The terrain is practically flat and the small deviations from the flatness of the terrain also cause an adaptation via the system block placer 12, that is to say a modulation of all row spacings, but only to a small extent here.

A further photovoltaic system 105 can be stored in the memory 10 and is available for a subsequent optimization via the computer core 16.

All system blocks that have been explained up till now for the figures had a rectangular basic structure. However, the system blocks may also be embodied in a different form, for example as L-shaped system blocks.

Such an L-shape, which is not illustrated separately in the drawings, is produced from a rectangular block when some panel rows have been omitted in one block half. On the basis of the system block $S_1$ from FIG. 3, it is thus possible to envisage that the panel rows $T_1$, $T_2$, $T_5$ and $T_6$ are omitted. The system block $S_1$ then has an L-shaped structure because its delimiting line has a recess in the lower left-hand corner.

These L-shaped blocks can also be placed beside one another, wherein they also do not overlap when an L-shaped block mirrored twice is arranged close to an original L-shaped block.

These are then said to be arranged close to each other without gaps in the sense of having been placed without gaps.

Figure 15:
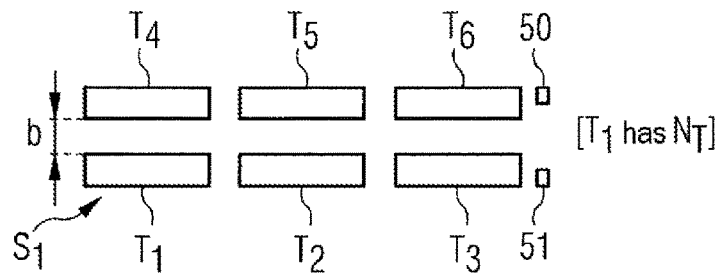
FIG. 15 shows a GJB block consisting of six solar panels.

A GJB block in the example of FIG. 15 is a sub-unit of a first system block as has been explained with reference to FIGS. 3 and 4. There, an inverter was part of the system block as well as a track starting from the edge. Both are omitted, however the GJB block is assigned to a junction box and in the example of FIG. 15 has six solar panels $T_1$ to $T_6$, which are each electrically connected in an AJB (array junction box) in order to electrically connect the strings of the solar surface 20 from FIG. 1.1 and in order to enable these to be continued by a line.

Six panels $T_1$ to $T_6$ are shown in FIG. 15 and are arranged in two rows, each formed of three panels with a spacing "b". Either an upper or a lower GJB 50 or 51 are arranged to the right of the panels $T_3$ and $T_6$. The electrical bus lines lead in from all AJBs of all panels lead here. That is to say either to the upper GJB 50 or to the lower GJB 51.

Figure 16A:
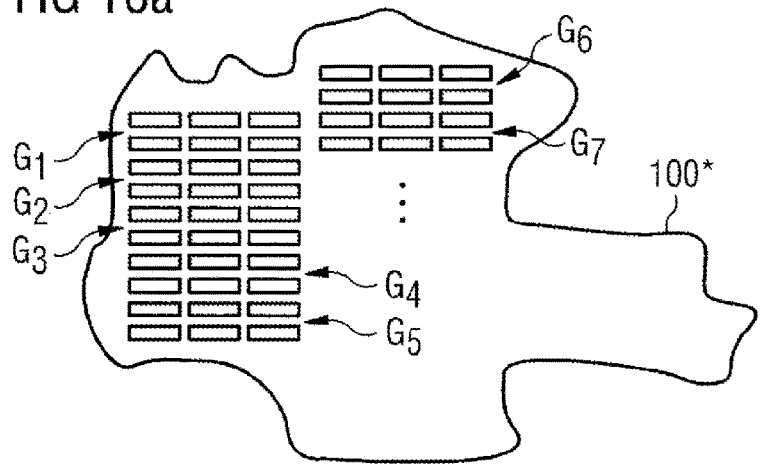
FIG. 16a shows placements of GJB blocks in a system area 100*.

The placement of this GJB block S1, also referred here to as a system block, is shown in placed form in groups of in each case six solar panels in FIG. 16a, wherein a first column has already been completed and a second column has just been started. The area 100* is provided with a complex delimitation (area edge). This may be one reason why larger system blocks according to FIG. 4 are less suited here.

Seven placed GJB blocks of the type $S_1$ are produced and have been placed as $G_1$, $G_2$ to $G_7$ within the system area 100* in FIG. 16a.

The placement is performed by a modified functional element 12, which receives the topology data 13 and also "modulates" the spacing b of the placed blocks G1 to G7 from FIG. 16a in a manner controlled by the topology. Only a row spacing b can be seen in FIG. 15, such that only a row spacing within a placed block is adapted to the topology of the location via 13, 13a and the functional element 12.

The transformer station has been omitted in this illustration for reasons of simplification.

Figure 16B:
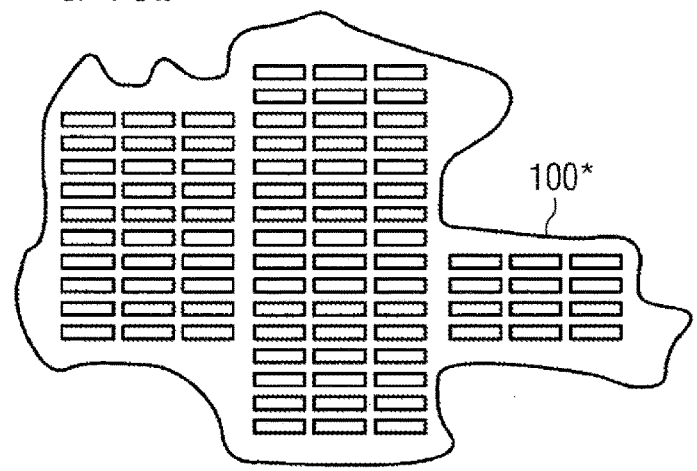
FIG. 16b show placements of GJB blocks in a system area 100*.

FIG. 16b shows the complete filling of the available area 100*. It can be seen that no further GJB blocks from FIG. 15 (made smaller in FIGS. 16a and 16b) can be placed. The placement in FIGS. 16a and 16b also does without the reproduction of the GJB junction boxes 50 or 51, which are to be imagined by a person skilled in the art.

The GJB system block from FIG. 15 is determined by a modified generator circuit 11 from FIG. 1 with the aid of a display screen and a user, which define or can change a specified GJB system block $S_1$ as a GJB block so as to allow it to be used via the auto-placer 12. The system block is therefore adaptive, that is to say adapts to the specification and is also adaptive in terms of the spacing b, during the placement, in actual fact before the placement, so as to then place said block with topology-modulated spacing in FIG. 16a until the completion according to FIG. 16b is achieved.

The number of solar panels in the GJB block is calculated from the nominal power of the DC-AC converter, the inputs thereof (the number of its current-receiving inputs), and the nominal power of a solar panel. A solar panel number is thus produced as a result of the division of inverter nominal power divided by the product of the number of inputs of the inverter and the nominal power of the panel. It is thus clear that each solar panel of a formed GJB group is connected to an input of the inverter.

The functional reasoning is that no more (or not much more) DC power is to be present at an inverter than can be received thereby, and that the nominal power is to be distributed as uniformly as possible between the inputs of the inverter. Thus, the nominal power is divided by the number of inputs of the inverter. In order to determine the panels per connection, the desired power per input is additionally divided by the nominal power of one of the solar panels. The number of solar panels per GJB block is thus given (with a 1:1 assignment of a GJB to just one input at the inverter).

The determination of the number of solar panels can be rounded up or rounded down. Of course, it must be an integer.

A fixed number of identical solar panels $T_1$ to $T_6$ are provided. A DC-AC converter not yet placed is envisaged, but is not yet placed. It has a certain number of inputs, which is predefined. It also has a certain nominal power, which is also known. Both determine the fixed number of panels in the system block $S_1$. The arrangement of the panels in a fixed number of rows and columns, in FIG. 15 two rows and three columns, is also predefined for the GJB block.

Figure 18:
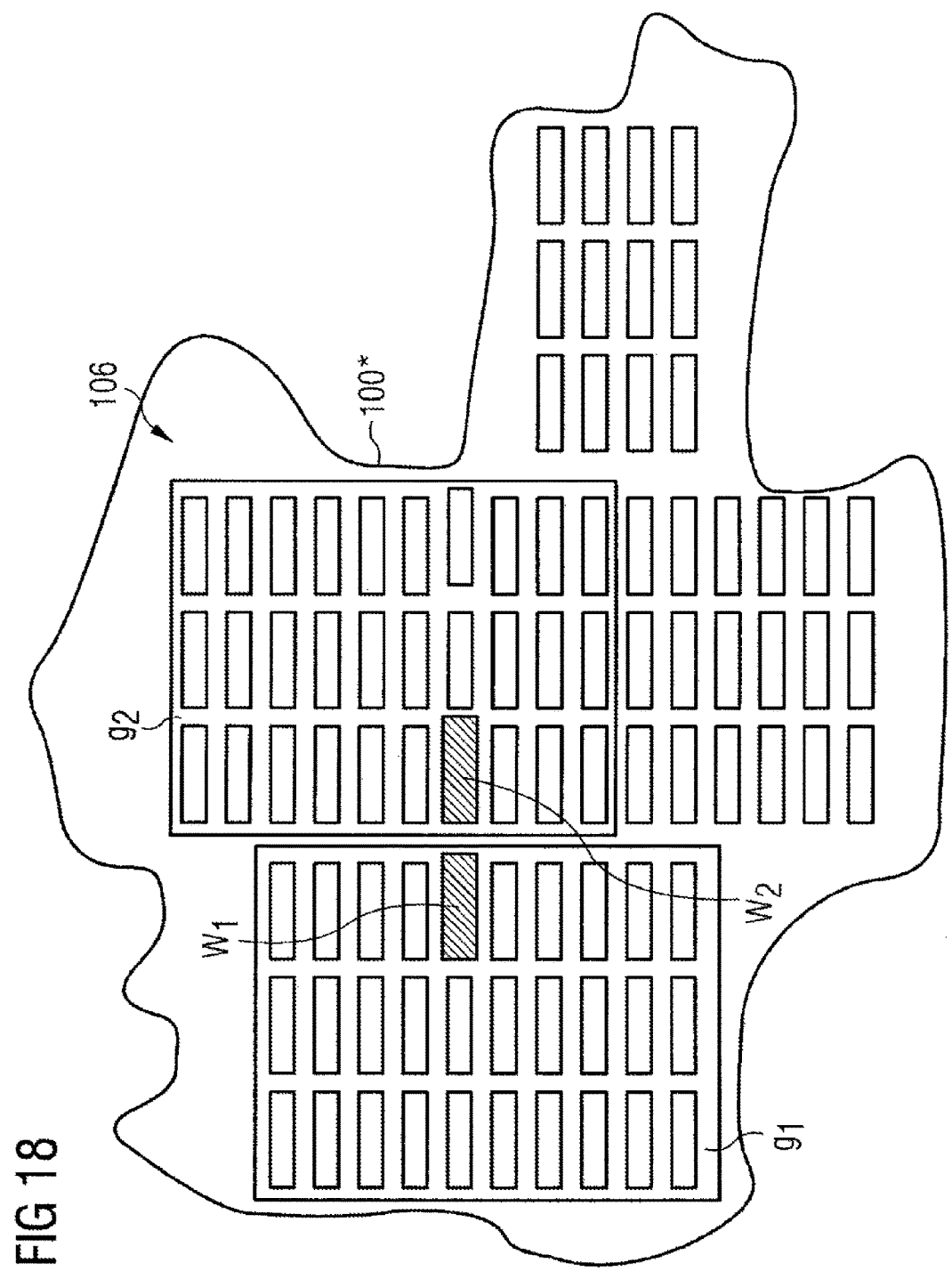
FIG. 18 shows the installation of inverters W1 and W2 in the grouping g1 and g2 of the inverter catchment area from FIG. 17.

This is calculated on the basis of the fact that a multiplicity of GJB blocks are to be placed and subsequently electrically assigned to a DC-AC converter, as is illustrated in FIG. 18. Only the exact placement of the individual GJB blocks is not already fixed for the entire inverter, and instead is constructed by successive placement of GJB blocks and is adapted to a more complex area 100*.

There must be no overlapping during the placement. The blocks are strung together in accordance with two termination criteria, more specifically the fact that the nominal power (or approximately the nominal power) has been reached and/or the fact that the limits 100* of the system area have been exceeded. Due to the smaller nominal power of the GJB block, more of these system blocks are to be placed, however it is also possible to approach the limits 100* of the system area more closely.

If the area 100* is occupied, that is to say if one of the termination criteria has signaled that no further GJB blocks can be placed, the placement is ended.

Figure 17:
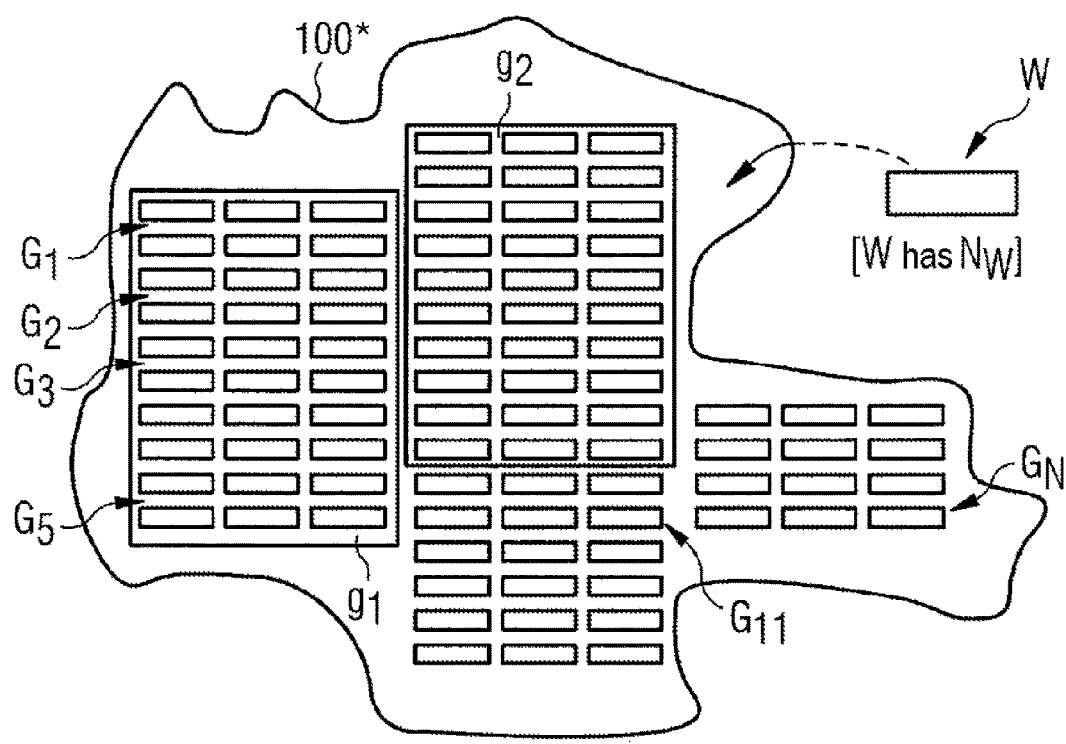
FIG. 17 illustrates the assignment of an inverter area to a group "g" of placed GJB blocks.

It can be assumed from FIG. 15 that a solar panel has the nominal power $N_T$. The inverter W from FIG. 17 to be placed subsequently has an inverter nominal power Nw. Both variables are used to define the fixed number of identical solar panels in the GJB block so as to then place this system block $S_1$ multiple times in a continued manner without overlap with GJB blocks already placed.

Following the complete (terminated) placement according to FIG. 16b, inverter areas are defined that each comprise a multiplicity of GJB blocks. In the example, a group g1 is formed, which includes the first five GJB blocks $G_1$ to $G_5$. These are shaded in gray. With the nominal power of a GJB block multiplied by five times, the nominal power Nw of the inverter W to be placed is approximated or reached.

FIG. 18 illustrates the fact that the inverter W has been placed at a location of one of the panels. A panel of the third group $G_3$ (corresponding to the panel $T_6$ from FIG. 15) is removed, and in its place an inverter W is placed as $W_1$, which, in the placed form inverter $W_1$, is in the inverter area $g_1$. An "inverter area" is nothing more than a fixed group $g_i$ of GJB blocks.

The group formation continues. It is continued until there are no longer ungrouped GJB blocks in the system area 100\*. This is not yet the case in FIG. 18; here, five ungrouped GJB blocks $G_{11}$ to $G_N$ are still present. These can be combined, in a manner spanning a column, to form a last group $g_3$, which provides the same nominal power as the previous group formations $g_1$ and $g_2$.

If all placed GJB blocks are contained in groups, the group formation is complete.

If so many GJB blocks are placed that the last group has fewer GJB blocks than the number of inputs of the inverter to be assigned, some inputs of the last-placed inverter remain open. Another inverter may also be placed at this location, said inverter having a lower power or having a different number of inputs. The last group thus formed can also be considered as the group that leads to a post-structuring, that is to say to the completion, as is possible but seldom occurs.

For each solar panel that is removed, an inverter $W_1$, $W_2$ is placed in FIG. 18.

Figure 19:
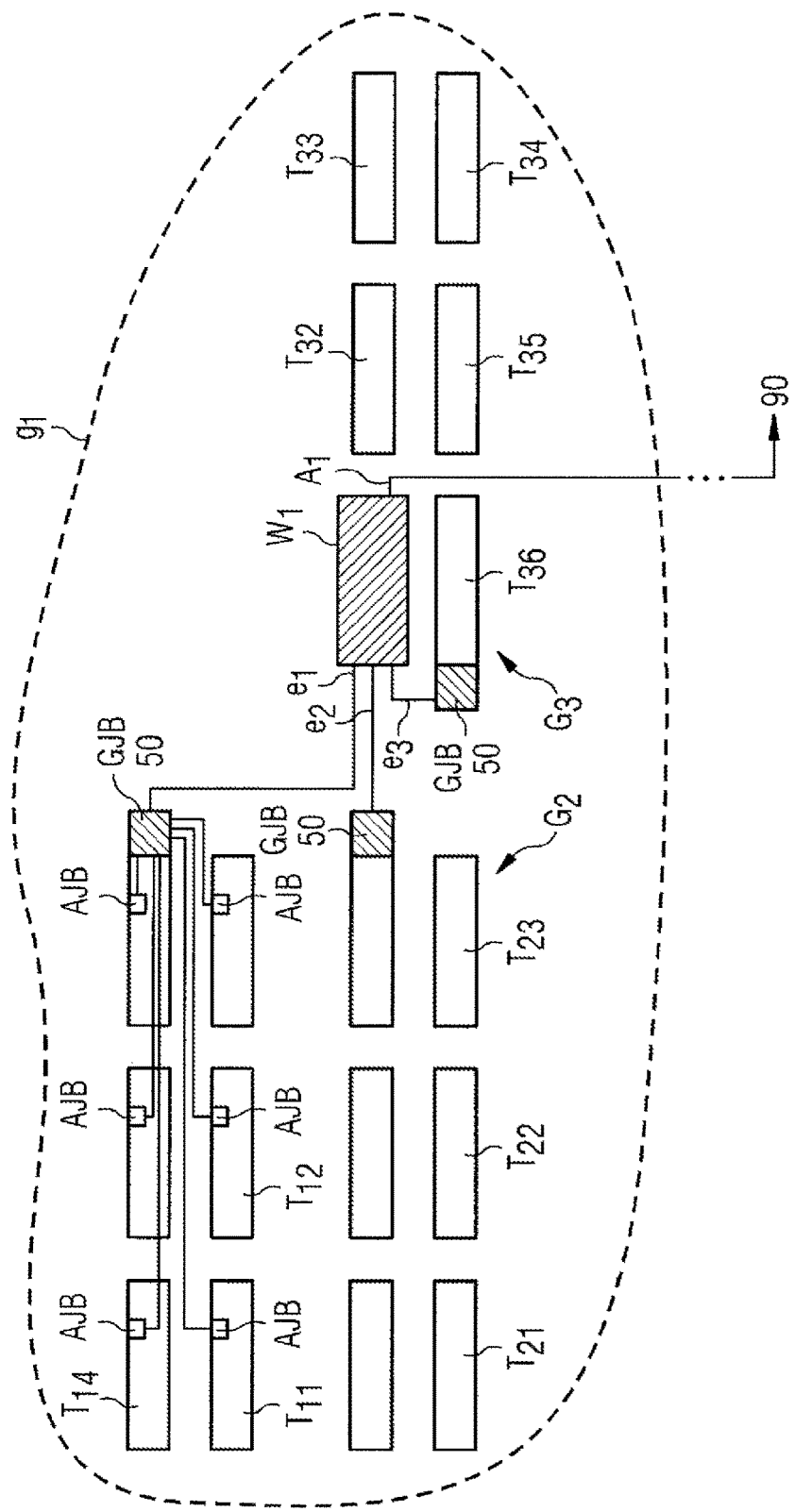
FIG. 19 illustrates the electrical connection of the placed GJB system blocks, which are grouped and are provided with DC-AC converters according to FIG. 18.

The GJB blocks of the formed groups are electrically connected such that each GJB block is electrically connected to one of the plurality of inputs of the respective placed DC-AC converter (as an example of the inverter). The inverter will have previously predefined a certain number of inputs $e_1$, $e_2$, $e_3$ to $e_N$, and each of these inputs is now fed electrically conductively from a current-carrying cable, which originates from a GJB connector or collection box (junction box). This is illustrated in FIG. 19, which is explained further below.

Each inverter input thus has a GJB block as a current supplier (only one in this example).

Here too, a termination criterion is given when all GJB blocks that have been placed are grouped and electrically connected to a placed inverter.

With corresponding application of the possible adaptations given previously for the system blocks with inverters, that is to say the shearing or the mirroring about one or two central planes in accordance with FIGS. 3, 3.1 and 3.2, this is also possible for the GJB blocks of FIG. 15. These possibilities are not illustrated separately in FIGS. 15 to 18, but can be assumed from the prior description. Post-structuring is also possible, but rarely occurs, since the GJB blocks already have a smaller discrete power than the large system blocks already assigned to an inverter. In the example in FIG. 18 with five GJB blocks combined at each inverter, ⅕ of the discretization of the system block from FIG. 3 can be achieved.

A partial GJB block for potential post-structuring could consist for example of a single panel row $T_1$ to $T_3$ in order to adapt the power of the system to the required nominal value.

The embodiment in an L-shape or as a rectangle is also possible for the GJB block.

If a number of spacings b are provided in the GJB block, a number of spacings are the same. However, just one spacing b may also be provided, which then may not be equal to a different spacing, see FIG. 15.

FIG. 19 is intended to explain in greater detail how to implement the concept of the connection of a GJB from FIG. 18. In order to simplify the overview, only three groups are placed here, which have three GJBs 50 and are associated with the group $g_1$. This group $g_1$ is the inverter area of the inverter $W_1$ already placed, which is provided in the place of the panel $T_{31}$.

It can be seen from FIG. 19 that two GJB blocks $G_1$ and $G_2$ have been placed one above the other on the left-hand side, each having a GJB 50 as shown in FIG. 15 (upper application). The third-placed GJB block $G_3$ is mirrored about two primary planes, that is to say rotated about the central axis, such that the GJB block 50 comes to rest at the bottom, but remains next to the last panel $T_{36}$.

The connections in electrically conductive form are shown on the basis of the example of the placed GJB block $G_1$. Each solar panel of the six solar panels $T_{11}$ to $T_{16}$ (first-placed block, six panels 1 to 6) has an AJB, which combines all the strings of the respective panel. Each of the six AJBs is electrically conductively connected to the GJB 50 of the placed GJB block $G_1$. This GJB 50 has an electrical connection line, which leads to an input $e_1$ of the inverter $W_1$.

Accordingly, the two illustrated other inputs $e_2$ and $e_3$ of the inverter $W_1$ are fed from a corresponding GJB box 50 of a respective placed GJB system block. The inverter $W_1$ delivers the power, converted to AC voltage, at the output $A_1$, which leads to the transformer station 90.

It is assumed that the explanation concerning the placed GJB block $G_1$ can be transferred correspondingly to the other two placed blocks without showing there the respective AJBs and electrically conducting cables, which are also provided there, as they are in the placed GJB system block $G_1$.

The photovoltaic system 106 from FIG. 18 is also a photovoltaic system that is defined in terms of its structure and is stored in the memory component 10. The photovoltaic systems 101 to 106 collected there, which are composed from the method described here and are defined in terms of their structure, can lead via the optimization 16, 19 and the on-screen presentation to a photovoltaic system that utilizes the given area in the best possible way and meets the technical objectives predefined for the system in the best possible way.

All stored systems can be defined abstractly via their technical characteristic values. These are nominal power, number of panels, angle of inclination of the panels and/or annual yield. These technical variables make the systems comparable with one another.

A connection of the GJB blocks of a group g to the associated inverter can also be performed differently by connecting a number of GJB sub-blocks to an input of the inverter. The nominal power of an inverter is firstly divided by the number of the inputs and the nominal power of the solar panels (that is to say exactly as previously for the 1:1 case, in which only one GJB output is present at just one inverter input). The intermediate result is then divided by the number of GJBs connected to an input (for the 1:1 assignment, the divider is simply one). This new number is then rounded. The number of panels per GJB for this type of placement is thus determined.

The electrical connection for this type of placement with a number of GJB blocks per input e1 can also be derived from FIG. 19. The corresponding type of electrical connection is such that a number of GJBs 50 from a number of placed GJB system blocks supply current at an input of an inverter. With the factor k, it is measured how many GJB blocks are connected to an input of an inverter of the group g (the inverter area). FIG. 19 illustrates the electrical connection of the placed GJB system blocks, which are grouped and provided with DC-AC converters according to FIG. 18.

Figure 20:
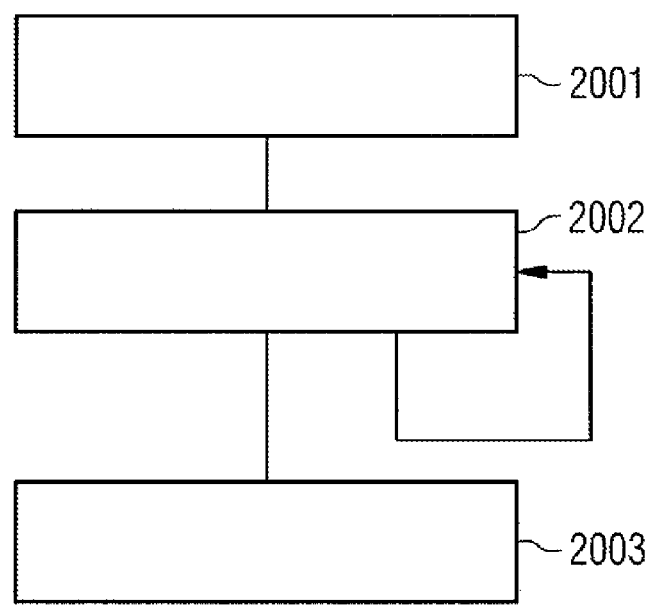
FIG. 20 shows a schematic flow diagram of an exemplary embodiment of a method for defining a structure of a photovoltaic system.

FIG. 20 shows a schematic diagram of an exemplary embodiment of a method for defining a structure of a photovoltaic system.

In step 2001, a first placement 101 of a block at a location in the system area 100 with the local given topology is performed.

In step 2002, a placement 102 of further blocks $B_2$, $B_3$, . . . at further locations in the system area 100 is performed repeatedly without an overlap with blocks already placed previously, wherein, prior to a respective placement of a further block $B_2$, $B_3$, . . . at one of the further locations in the system area 100, the row spacings $a_1$, $a_2$, $a_3$, $a_4$ of the solar panels $T_1$, $T_5$, $T_9$ of the respective further block ($B_2$, $B_3$, . . . ) are adapted to the topology given at the location of the placement of the respective further block $B_2$, $B_3$, . . . in the system area 100, whereby an extension of the further block $B_2$, $B_3$, . . . in the direction of the column of the solar panels of the further block $B_2$, $B_3$, . . . changes.

In step 2003, the placement of further blocks $B_2$, $B_3$, . . . ends if, by a placement of a further block $B_2$, $B_3$, . . . , the nominal power of a photovoltaic system corresponding to the structure would be exceeded, or if no further block $B_2$, $B_3$, . . . can be placed without overlapping blocks already placed previously.

The invention claimed is:

1. A computer-assisted method of constructing a photovoltaic system in a given system area with a local given topology, wherein the photovoltaic system comprises a multiplicity of solar panels, a plurality of DC-AC converters and at least one transformer station, wherein the solar panels are electrically connected to the DC-AC converters by cabling, and wherein the plurality of DC-AC converters are electrically connected by the cabling to the at least one transformer station, wherein a multiplicity of adaptive blocks is used to configure the photovoltaic system on a computer system from at least 80% of a nominal power of the photovoltaic system, and wherein a first one of the multiplicity of adaptive blocks represents in a memory of the computer system a first system block, wherein the first system block comprises the following components:
a first fixed number of solar panels and a first arrangement of the solar panels in a first fixed number of rows and columns, wherein the first arrangement comprises a first specification of row spacings between the rows;
a first DC-AC converter; and
a first access from an edge of the first system block to the DC-AC converter;

the method comprising:
a) representing the system area and the local given topology thereof in the memory of the computer system;
b) the computer system placing the first one of the adaptive blocks at a start location in the system area with the local given topology as represented in the memory of the computer system;
c) the computer system placing further ones of the adaptive blocks at further locations in the system area without overlapping with adaptive blocks already placed previously;
d) wherein, prior to a respective placing of the first and further adaptive blocks at respective locations in the system area, adapting the row spacings of the solar panels of each respective adaptive block to the topology and to a solar shadow angle at the location of the respective adaptive block in the system area to control shading of one row by another row of the respective adaptive block resulting in the adaptive block experiencing a size change based on the topology which extends the adaptive block in the column direction by lengthening or shortening the adaptive block as a result of changes in the row spacings, such that the placement in the system area of the further adaptive blocks is directly affected by the size change of the previously placed block to avoid overlap;
e) ending the placing of the further adaptive blocks if, by a placement of a further adaptive block, the nominal power of the photovoltaic system would be exceeded, or if no further adaptive block can be placed without overlapping adaptive blocks already placed previously in the system area;
f) repeating steps (b)-(e) for one or more different start locations resulting in a variety of layouts of producible photovoltaic systems; and
g) selecting a layout and installing the photovoltaic system in the system area corresponding to the selected layout, such that the installed photovoltaic system comprises multiple adaptive blocks, each placed and adapted for the local given topology.

2. The method as claimed in claim 1, further comprising:
configuring a further structure of the photovoltaic system, wherein the multiplicity of the adaptive blocks further represents in the memory of the computer system a second system block, wherein the second system block comprises the following components:
a second fixed second number of solar panels and a second arrangement of the solar panels in a second fixed number of rows and columns, wherein the second arrangement comprises a second specification of row spacings between the rows;
a second DC-AC converter; and
a second access from an edge of the second system block to the second DC-AC converter.

3. The method as claimed in claim 2, wherein the first system block and/or the second system block is/are L-shaped, or wherein not all rows of the first system block and/or of the second system block are completely occupied with solar panels.

4. The method as claimed in claim 2, wherein a planar extension of the first system block and/or of the second system block is a rectangle.

5. The method as claimed in claim 2, wherein the number and arrangement of the solar panels of one of the first or second system blocks with a given size of the respective system block also predefines uniform column spacings of the solar panels.

6. The method as claimed in claim 2, further comprising assembling the first system block and/or the second system block as a generator junction box block comprising a module of solar panels, and wherein one of the solar panels of the module comprises a generator junction box, to which all solar panels within the module are electrically connected.

7. The method as claimed in claim 2, further comprising:
forming multiple groups of generator junction box blocks as represented by respective adaptive blocks, each generator junction box block comprising multiple solar panels electrically connected to a generator junction box;
placing a DC-AC converter instead of a solar panel in one of the generator junction box blocks in each formed group; and
electrically connecting the generator junction boxes of each group to inputs of the DC-AC converter in the group until all generator junction box blocks are grouped, placed in the system area, and electrically connected.

8. The method as claimed in claim 2, further comprising constructing one of the first or second system blocks, wherein a predefined DC-AC converter has a nominal power, from which the number of solar panels in the first or second system block is ascertained under consideration of a nominal power of a solar panel belonging to the first or second system block.

9. The method as claimed in claim 1, wherein the multiplicity of adaptive blocks is used to configure the photovoltaic system from at least 90% to 95% of the nominal power of the photovoltaic system.

10. The method as claimed in claim 1, wherein a remainder of the photovoltaic system up to 100% of the nominal power of the photovoltaic system is post-structured with at least one partial adaptive block or with a different adaptive block in order to complete the photovoltaic system.

11. The method as claimed in claim 1, wherein at least some of the adaptive blocks are mirrored about a central plane of a corresponding system block prior to the adaptation of the row spacings in said at least some of the adaptive blocks.

12. The method as claimed in claim 1, wherein at least some of the adaptive blocks to be placed are sheared, comprising offsetting rows of solar panels thereof to form a parallelogram shape, prior to the placing and prior to the corresponding adaptations of the row spacings.

13. The method as claimed in claim 1, wherein for the variety of layouts of producible photovoltaic systems, a plurality of technical variables is determined to enable a technical comparison of the variety of layouts of producible photovoltaic systems,
wherein the technical variables comprise one or more of nominal power of the system, annual yield in energy produced, angle of inclination of the panels, number of required components, complexity of wiring, and assembly and maintenance requirements of the system.

14. The method as claimed in claim 13, wherein the variety of layouts of producible photovoltaic systems with their respective plurality of technical variables are stored in a database of the computer system for presentation on a display, a selection, a comparison with one another, or a selection based on optimization objectives.

15. The method of claim 1, further comprising:
storing in a database of the computer system a plurality of predefined adaptive blocks, each of the predefined adaptive blocks representing a respective configuration of solar panels comprising a given number of panels in a given number of rows and an inclination angle of the panels for a given installation latitude; and
retrieving selected ones of the predefined adaptive blocks for use in said multiplicity of adaptive blocks.

16. A method of designing and installing a photovoltaic system in a location with a local given topology, wherein the photovoltaic system comprises a plurality of adaptive blocks, each adaptive block comprising a number of rows and columns of solar panels with adaptable row spacing, the method comprising:
a) representing the location on which a photovoltaic system is to be installed as a represented system area that includes a local given topology thereof in a memory of a computer system;
b) placing by the computer system a first one of the adaptive blocks at a start location in the represented system area;
c) placing by the computer system further ones of the adaptive blocks at further locations in the represented system area without overlapping with adaptive blocks already placed previously;
d) wherein, prior to a respective placing of the first and further adaptive blocks at respective locations in the represented system area, adapting the row spacings of the solar panels of each respective adaptive block to the topology and to a solar shadow angle at the location of the respective adaptive block in the represented system area to control shading of one row by another row of the respective adaptive block, resulting in the adaptive block experiencing a size change based on the topology which extends the adaptive block in the column direction by lengthening or shortening the adaptive block as a result of changes in the row spacings, such that the placement in the represented system area of the further adaptive blocks is directly affected by the size change of the previously placed block to avoid overlap;
e) terminating by the computer system the placing of the further adaptive blocks based on reaching a termination condition;
f) repeating steps (b)-(e) for one or more different start locations resulting in a variety of layouts of producible photovoltaic systems; and
g) selecting a layout and installing the photovoltaic system in the location corresponding to the selected layout, such that the installed photovoltaic system comprises the plurality of adaptive blocks, each placed and adapted for the local given topology.

17. The method of claim 16, wherein the termination condition comprises a determination that a desired percentage of a nominal power of the photovoltaic system would be exceeded, or a determination that no further adaptive block can be placed without overlapping adaptive blocks already placed previously in the represented system area.

18. The method of claim 17, wherein the desired percentage of the nominal power comprises at least 80% of the nominal power of the photovoltaic system.

19. The method of claim 16, wherein for the variety of layouts of producible photovoltaic systems, a plurality of technical variables is determined to enable a technical comparison of the variety of layouts of producible photovoltaic systems,
wherein the technical variables comprise one or more of nominal power of the system, annual yield in energy produced, angle of inclination of the panels, number of required components, complexity of wiring, and assembly and maintenance requirements of the system.

20. The method of claim 16, wherein the variety of layouts of producible photovoltaic systems with their respective plurality of technical variables are stored in a database of the computer system for presentation on a display, a selection, a comparison with one another, or a selection based on optimization objectives.

\* \* \* \* \*